United States Patent
Ohmi et al.

(10) Patent No.: US 7,820,558 B2
(45) Date of Patent: Oct. 26, 2010

(54) SEMICONDUCTOR DEVICE AND METHOD OF PRODUCING THE SEMICONDUCTOR DEVICE

(75) Inventors: Tadahiro Ohmi, Miyagi (JP); Akinobu Teramoto, Miyagi (JP); Koutaro Tanaka, Miyagi (JP)

(73) Assignees: Tohoku University, Miyagi (JP); Foundation for Advancement of International Science, Ibaraki (JP)

( * ) Notice: Subject to any disclaimer, the term of this patent is extended or adjusted under 35 U.S.C. 154(b) by 258 days.

(21) Appl. No.: 11/812,807

(22) Filed: Jun. 21, 2007

(65) Prior Publication Data
US 2008/0135954 A1    Jun. 12, 2008

(30) Foreign Application Priority Data
Dec. 8, 2006    (JP) .............................. 2006-332003

(51) Int. Cl.
*H01L 21/31* (2006.01)
*H01L 29/76* (2006.01)

(52) U.S. Cl. .................. 438/778; 438/788; 438/792; 257/410; 257/411

(58) Field of Classification Search .............. 438/778, 438/786, 787, 788, 791, 792; 257/347, 407, 257/410, 411
See application file for complete search history.

(56) References Cited

U.S. PATENT DOCUMENTS

| | | | |
|---|---|---|---|
| 5,972,801 A * | 10/1999 | Lipkin et al. | 438/770 |
| 6,214,107 B1 | 4/2001 | Kitabatake | |
| 6,273,950 B1 | 8/2001 | Kitabatake | |
| 6,452,228 B1 * | 9/2002 | Okuno et al. | 257/329 |
| 6,620,744 B2 * | 9/2003 | Nakata et al. | 438/787 |
| 6,956,238 B2 * | 10/2005 | Ryu et al. | 257/77 |
| 7,022,378 B2 * | 4/2006 | Das et al. | 427/255.29 |
| 2001/0015170 A1 | 8/2001 | Kitabatake | |
| 2007/0032040 A1 * | 2/2007 | Lederer | 438/455 |
| 2008/0124908 A1 * | 5/2008 | Forbes et al. | 438/591 |
| 2008/0128709 A1 * | 6/2008 | Chung et al. | 257/77 |
| 2009/0004883 A1 * | 1/2009 | Das et al. | 438/770 |

FOREIGN PATENT DOCUMENTS

| | | |
|---|---|---|
| JP | 2004-319907 A | 11/2004 |
| WO | WO 97/39476 | 10/1997 |

* cited by examiner

*Primary Examiner*—Kevin M Picardat
(74) *Attorney, Agent, or Firm*—Foley & Lardner, LLP

(57) ABSTRACT

A film with small hysteresis and high voltage resistance is obtained by reducing the carbon content in a gate insulating film on a SiC substrate. Specifically, the carbon content in the gate insulating film is set to $1 \times 10^{20}$ atoms/cm$^3$ or less. For this, using a plasma processing apparatus, a silicon oxide film is formed on the SiC substrate and then the formed silicon oxide film is reformed by exposure to radicals containing nitrogen atoms. Thus, the gate insulating film excellent in electrical properties is obtained.

25 Claims, 21 Drawing Sheets

|  | Kr/O$_2$/NO before PECVD (Ar anneal 1100°C) | PECVD | Kr/O$_2$/NO after PECVD |
| --- | --- | --- | --- |
| Oxide fixed charge (Q$_f$) [cm$^{-2}$] | $2.23 \times 10^{12}$ | $1.73 \times 10^{11}$ | $2.23 \times 10^{9}$ |
| Interface trap density (D$_{it}$) [cm$^{-2}$] | $6.73 \times 10^{11}$ | $1.23 \times 10^{11}$ | $3.34 \times 10^{10}$ |

FIG. 14

SEMICONDUCTOR DEVICE AND METHOD OF PRODUCING THE SEMICONDUCTOR DEVICE

This application claims the benefit of priority from Japanese Patent Application No. 2006-332003, filed Dec. 8, 2006, the disclosure of which is incorporated herein by reference in its entirety.

BACKGROUND OF THE INVENTION

This invention relates to a semiconductor device and a method of manufacturing the semiconductor device and, in particular, relates to a semiconductor device having a gate insulating film on a semiconductor region containing SiC as a main component and to a method of manufacturing such a semiconductor device.

MOS devices using Si (silicon) are currently widely used as semiconductor devices, but have a drawback that the withstand voltage is low for use as power devices. Means is taken for increasing the length of a drift region and reducing its concentration in order to increase the withstand voltage. However, there is a limit to the withstand voltage that can be increased thereby. Further, there is a problem that the on-resistance increases thereby. In view of this, IGBTs using silicon have been commercialized, but there is a problem that the switching speed is slow. Accordingly, attention has been paid to SiC having a withstand voltage about ten times greater than that of silicon. In addition, if comparison is made with the same withstand voltage, the on-resistance is one hundredth to one five-hundredth of Si devices. Further, since the thermal conductivity of SiC is about 3.3 times greater than that of Si, it is also excellent as high-temperature operating devices. WO97/39476 (Patent Document 1) discloses a SiC element applicable to a semiconductor element of a high-power device, a high-temperature device, an environment-resistant device, or the like and a manufacturing method thereof.

For realizing a transistor of a MOS (metal/insulating film/semiconductor) structure using SiC, a gate insulating film thereof is required to have various high-performance electrical properties and high reliability characteristics such as low leakage current characteristics, low interface trap density, and high voltage resistance.

In order to establish a gate insulating film forming technique satisfying these requirements, use has conventionally been made of a thermal oxidation, wet oxidation technique using oxygen molecules or water molecules at about 1200° C. or more.

Conventionally, when a silicon oxide film is formed on the SiC surface using such a thermal oxidation, wet oxidation technique, since the interface trap density is extremely high as compared with a silicon oxide film on the silicon surface, the channel resistance increases. As a result, realization of a high-mobility high-performance SiC MOS transistor has been impeded. Specifically, SiC is hexagonal and thus has no plane corresponding to a (100) plane of silicon. When an insulating film is formed by the conventional heat treatment method, only the insulating film with extremely large interface states is obtained.

Various processes have been attempted for solving such a problem in the conventional thermal oxidation process. Among them, the technique described in Japanese Unexamined Patent Application Publication (JP-A) No. 2004-319907 (Patent Document 2) introduces an inert gas and gaseous oxygen molecules into a plasma to cause the inert gas having a large metastable level to efficiently perform atomization of the oxygen molecules, thereby oxidizing the silicon surface by atomic oxygen O radicals. This technique achieves, in silicon, the low leak current characteristics, the low interface trap density, and the high withstand voltage equivalent to those of the conventional thermal oxidation by irradiating a microwave to a mixed gas of krypton (Kr) being an inert gas and oxygen (O) to generate a mixed plasma of Kr and $O_2$, thereby producing a large amount of atomic oxygen O radicals to carry out oxidation of silicon at a temperature of about 400° C. Further, according to this oxidation technique, a high-quality oxide film can also be obtained on the silicon surface having a plane orientation other than the (100) plane.

SUMMARY OF THE INVENTION

However, according to a silicon oxide film forming technique for the SiC surface using such a microwave-excited plasma, it is not possible to obtain excellent electrical properties as compared with the silicon oxide film formed by the conventional thermal oxidation, wet oxidation technique.

It is therefore an object of this invention to provide a semiconductor device having a gate insulating film with a low interface trap density on a semiconductor region containing SiC as a main component.

The present inventors have elucidated a reason why the excellent electrical properties cannot be obtained by the silicon oxide film forming technique for the SiC surface using the microwave-excited plasma and, as a result, have achieved this invention. At first, this reason will be explained hereinbelow.

FIG. 1 shows the high-frequency CV characteristics of a MOS capacitor having a gate insulating film obtained by directly radical-oxidizing the SiC surface.

The conditions for forming the gate insulating film were such that a later-described plasma processing apparatus was used and, while introducing a $Kr/O_2$ mixed gas at 310.5/16.3 sccm and setting the temperature of a substrate at 400° C. and the pressure in a process chamber at about 133 Pa (1 Torr), a microwave was supplied so as to directly oxidize the SiC surface by oxygen (O) radicals, thereby forming a silicon oxide film interface having a thickness of 9 nm. Thereafter, a CVD oxide film was deposited using a dual shower plate microwave-excited high-density plasma apparatus. This is for achieving the film thickness that can withstand the C-V characteristics measurement.

The film forming conditions were such that a $Kr/O_2$ mixed gas was introduced at 400/80 sccm and a $SiH_4$ gas was introduced at 0.2 sccm. The temperature and pressure in a process chamber were set to 400° C. and 133 Pa (1 Torr), respectively. The film thickness was 25.6 nm.

Referring to FIG. 1, the CV characteristics are largely shifted in a positive direction and, further, there exists a hysteresis. This shows that very high oxide fixed charge density and interface trap density of $10^{12}$/cm or more exist in the gate insulating film.

FIG. 2 shows the results of measuring, by a SIMS analysis, depth-direction distribution of carbon present in the insulating film obtained by directly radical-oxidizing the SiC surface as described above. The measurement conditions were such that the measurement was carried out using Cs ions at an acceleration voltage of 0.75 kV.

Referring to FIG. 2, it is seen that a large amount of carbon remains in the insulating film. It is considered that this residual carbon acts as negative charges to exert an influence upon degradation of the CV characteristics.

Therefore, the present inventors have conducted an experiment to examine whether gate insulating film properties are improved by forming an oxynitride film by directly oxynitriding the SiC surface and then annealing the film.

FIG. 3 shows the results thereof, i.e. the high-frequency CV characteristics of MOS capacitors each having a gate insulating film obtained by directly oxynitriding the SiC surface and annealing it.

The conditions for forming each gate insulating film were such that a later-described plasma processing apparatus was used and, while introducing a $Kr/O_2/NO$ mixed gas at 1000/30/0.001 sccm and setting the temperature of a substrate at 600° C. and the pressure in a process chamber at about 133 Pa (1 Torr), a microwave was supplied so as to directly oxynitride the SiC surface by oxygen (O) radicals and NO radicals, thereby forming a silicon oxynitride film having a thickness of 3 nm.

Thereafter, for achieving the film thickness that can withstand the C-V characteristics measurement, a CVD oxide film was deposited using a dual shower plate microwave-excited high-density plasma apparatus. The film forming conditions were such that a $Kr/O_2$ mixed gas was introduced at 400/80 sccm and a $SiH_4$ gas was introduced at 0.2 sccm. The temperature and pressure in a process chamber were set to room temperature and 133 Pa (1 Torr), respectively. The film thicknesses were, in terms of EOT, 14.5 nm for the film shown with a graph (a) in FIG. 3, 30.4 nm for the film shown with a graph (b), and 30.0 nm for the film shown with a graph (c). The film shown with the graph (a) in FIG. 3 was obtained by annealing the film, obtained in the manner as described above, in an Ar atmosphere at 1000° C., the film shown with the graph (b) was obtained by annealing the film, obtained in the manner as described above, in an Ar atmosphere at 1100° C., and the film shown with the graph (c) was obtained by annealing the film, obtained in the manner as described above, in an $Ar/O_2$ atmosphere at 1100° C.

Referring to FIG. 3, although the Vfb shift of the CV characteristics is improved, no improvement is observed with respect to the hysteresis.

FIG. 4 shows the results of measuring depth-direction concentrations of carbon present in the foregoing respective insulating films. FIG. 4A relates to the film shown with the graph (a) in FIG. 3, wherein the film contains $5 \times 10^{21}$ atoms/cm$^3$ or more of carbon. FIG. 4B relates to the film shown with the graph (b) in FIG. 3, wherein while the amount of carbon is reduced, the film still contains $1 \times 10^{21}$ atoms/cm$^3$ or more. FIG. 4C relates to the film shown with the graph (c) in FIG. 3, wherein while the amount of carbon is further reduced, the amount exceeding $1 \times 10^{20}$ atoms/cm$^3$ still remains. After all, it has been ascertained that the degradation of the CV characteristics is not improved even by the foregoing method.

Further, it has also been ascertained that when the CVD film is simply formed on the SiC surface, carbon exceeding $1 \times 10^{20}$ atoms/cm$^3$ is contained in the CVD film depending on the formation temperature and so on.

According to the present invention, there is provided a semiconductor device having a gate insulating film on a semiconductor region containing SiC as a main component, wherein: the gate insulating film has a carbon content of $1 \times 10^{20}$ atoms/cm$^3$ or less. In particular, the gate insulating film has an oxide fixed charge of $1 \times 10^{11}$ cm$^{-2}$ or less and an interface trap density of $1 \times 10^{11}$ cm$^{-2}$ or less.

According to the present invention, there is provided a semiconductor device having a gate insulating film on a semiconductor region containing SiC as a main component, wherein: the gate insulating film includes a film obtained by reforming a silicon oxide film or a silicon oxynitride film deposited on a surface of the semiconductor region, using radicals containing at least nitrogen atoms. The gate insulating film preferably contains silicon, oxygen, and nitrogen.

The gate insulating film according to the present invention is a film obtained by reforming a silicon oxide film or a silicon oxynitride film deposited on a surface of the semiconductor region, using oxygen radicals and radicals containing nitrogen atoms.

The radicals containing the nitrogen atoms are at least one of nitrogen radicals, NO radicals, and $NH_3$ radicals.

Preferably, the gate insulating film has a thickness of 5 to 50 nm.

Preferably, a gate electrode is formed on the gate insulating film, and a source region and a drain region are formed in the semiconductor region.

Further, according to the present invention, there is provided a method of manufacturing a semiconductor device, comprising the steps of forming a gate insulating film on a surface of a semiconductor region containing SiC as a main component; and forming a gate electrode on the gate insulating film, wherein the step of forming the gate insulating film includes a first step of depositing a first film made of at least one of a silicon oxide and a silicon oxynitride on the surface of the semiconductor region containing the SiC as the main component, and a second step of exposing the first film to radicals containing at least nitrogen atoms in order to introduce the nitrogen atoms into the first film.

There is provided a method of manufacturing a semiconductor device wherein the second step is a step of reforming the first film with oxygen radicals and radicals containing nitrogen atoms.

There is provided a method of manufacturing the semiconductor device, wherein the first film is a silicon oxide film.

There is provided a method of manufacturing the semiconductor device, wherein the first film is a silicon oxynitride film.

There is provided a method of manufacturing the semiconductor device, wherein the radicals containing the nitrogen atoms are at least one of nitrogen radicals, NO radicals, and $NH_3$ radicals.

There is provided a method of manufacturing the semiconductor device, wherein a thickness of the first firm is set to 5 to 50 nm.

There is provided a method of manufacturing the semiconductor device, wherein the second step further comprises a step of forming the radicals containing the nitrogen atoms from a gas containing at least nitrogen using a microwave-excited plasma.

There is provided a method of manufacturing the semiconductor device, wherein: the first step comprises the steps of generating a microwave-excited plasma, introducing a film forming gas into the plasma, and thereby forming the film of at least one of the silicon oxide and the silicon oxynitride by CVD.

There is provided a method of manufacturing the semiconductor device, wherein: the microwave-excited plasma is generated in a process chamber using a plasma processing apparatus comprising:

a holding stage for holding a substantially flat processing substrate having the semiconductor region containing the SiC as the main component, a shower plate provided so as to face the holding stage and having an area greater than the processing substrate and a plurality of gas ejection holes for ejecting a plasma excitation gas into the process chamber, the gas ejection holes being provided so that the plasma excitation gas is ejected substantially uniformly into a space in the process chamber over an entire portion of the area, greater than the processing substrate, of the shower plate, a dielectric plate provided on a side of the shower plate opposite to the holding stage, and an antenna plate provided outside the dielectric plate and having an area equal to or greater than the area of the shower plate, the antenna plate being adapted to substantially uniformly radiate a microwave, through the dielectric plate and the shower plate, into a space in the process chamber corresponding to the entire portion of the area of the shower plate over the area, so that, in the space in the process chamber corresponding to the entire portion of the area of said shower plate, the plasma excitation gas ejected in the space is irradiated with the microwave to thereby generate the plasma substantially uniformly over the area.

Preferably, the antenna plate is an antenna plate with concentrically arranged linear slots. Further, the gas containing nitrogen is preferably at least one of a nitrogen gas, a NO gas, a $NH_4$ gas, and a $NF_3$ gas.

Preferably, the second step further comprises a step of generating the microwave-excited plasma from at least one of the gas containing nitrogen and a noble gas or a step of generating the microwave-excited plasma from the gas containing nitrogen, a noble gas, and an oxygen gas.

Preferably, the method further comprises a step of forming a source region and a drain region in the semiconductor region.

Preferably, as the noble gas, at least any one of krypton (Kr), argon (Ar), and xenon (Xe) is contained. For example, in a combination of an oxygen gas and krypton (Kr), oxygen radicals and krypton (Kr) during film formation remain in a formed oxide film, so that the properties (insulating properties, interface properties) for the insulating film are improved.

Nitrogen is contained in the foregoing reformed insulating film. With a concentration distribution in which the nitrogen concentration increases at the surface of the insulating film and at the interface between the insulating film and SiC as compared with at the middle portion of the insulating film, the properties (insulating properties, interface properties) for the insulating film are improved.

According to this invention, a gate insulating film with small interface trap density is obtained. Thus, it is possible to realize higher performance and higher reliability of a transistor. Further, according to this invention, it is possible to form an insulating film excellent in any plane orientation. As a result, it is possible to suppress an increase in interface trap and thus to manufacture a semiconductor device having excellent device properties.

A semiconductor device of this invention is particularly suitable for a power device required to have high voltage resistance. The thickness of an insulating film can be set to about 30 nm or 50 nm without degrading the device properties. This is because the thickness of the insulating film can be easily increased since film deposition by plasma CVD is carried out.

BRIEF DESCRIPTION OF THE DRAWINGS

FIG. 14 is a diagram showing the oxide fixed charge and interface trap density of the gate insulating film obtained by the foregoing insulating film forming process.

DETAILED DESCRIPTION OF THE INVENTION

Figure 1:
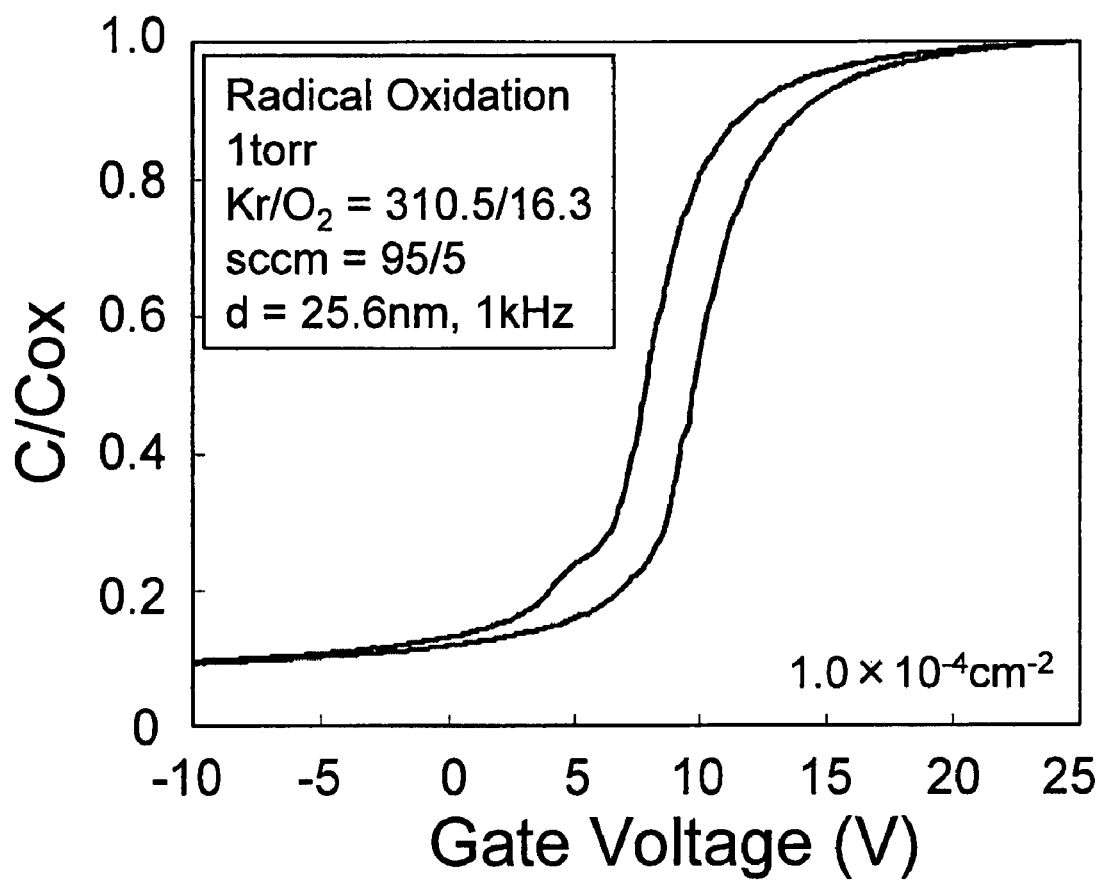
FIG. 1 is a diagram showing the high-frequency CV characteristics of a MOS transistor having a gate insulating film obtained by directly radical-oxidizing the SiC surface.

Hereinbelow, preferred embodiments applied with this invention will be described in detail with reference to the drawings.

At first, referring to FIG. 5, description will be given of a structural example of a plasma processing apparatus 100 for use in this invention.

The plasma processing apparatus 100 has a vacuum container 101 provided with a substrate holding stage 115 holding a SiC substrate 114 as a processing substrate. Gases in the process container 101 are exhausted from exhaust ports 116 through an exhaust pump (not shown). The substrate holding stage 115 has a heater function of heating the SiC substrate 114. A space 101A is provided around the substrate holding stage 115 for efficiently performing the exhaust.

The container 101 is provided at its top with an opening corresponding to the SiC substrate 114 on the substrate holding stage 115. This opening is closed by a dielectric plate 102 made of quartz or $Al_2O_3$. A planar antenna 110C is disposed over the dielectric plate 102 (outside the process container 101). The planar antenna 101C is formed with a plurality of linear slots 110a and 110b concentrically arranged for uniformly radiating a microwave supplied through a waveguide 110A (see FIG. 5B). Further, a wavelength shortening plate 110B and the waveguide 110A are disposed over (outside) the planar antenna 110C. Cooling means (not shown) is disposed over the wavelength shortening plate 110B. A plasma process chamber in the process container 101 comprises a plasma generating space 101B and a plasma processing space 101C in the example of this figure (dual shower plate structure). Incidentally, in a single shower plate structure (a lower shower plate 111 and its related portions are removed from the structure of the figure), a space over the SiC substrate 114 doubles as a plasma space and a plasma processing space.

In the process container 101, an upper shower plate 103 made of a material such as ceramic adapted to transmit a microwave and having a number of gas ejection holes 107 is disposed between the holding stage 115 and the dielectric plate 102 so as to face the SiC substrate 114. A plasma excitation gas introduced from a plasma gas supply port 105 is introduced through a gas supply passage 106 into a gap between the dielectric plate 102 and the upper shower plate 103 and then, through the gas ejection holes 107 of the upper shower plate 103, is uniformly ejected into the plasma generating space 101B under the upper shower plate 103. A gas flow controller (not shown) as flow rate adjusting means is connected to the plasma gas supply port 105. On the other hand, a microwave of several GHz for exciting a plasma is generated by an electromagnetic wave generator (not shown). This microwave generated by the electromagnetic wave generator passes through the waveguide 110A and a wave delay plate 110D so as to be uniformly radiated by the planar antenna 110C and then is transmitted through the dielectric plate 102 and the upper shower plate 103 so as to be uniformly irradiated into the plasma generating space 101B. In this manner, the plasma excitation gas introduced there is exited. As a result, a high-density plasma with a low electron temperature is uniformly generated in the plasma generating space 101B. In the single shower plate structure, the surface of the SiC substrate 114 is processed by this plasma.

In the illustrated dual shower plate structure, the lower shower plate 111 is disposed between the plasma generating space 101B and the SiC substrate 114. Through openings between mesh pipes 113 (may also be a structure other than the pipes), the plasma in the plasma generating space 101B diffuses into the plasma processing space 101C where plasma treatment on the surface of the wafer 114 is performed. A gas for the plasma treatment is introduced into the pipes 113 of the lower shower plate 111 from process gas supply ports 112 and then is ejected into the plasma processing space 101C through a number of small holes (not shown) formed in the pipes 113.

First Embodiment

Figure 5A:
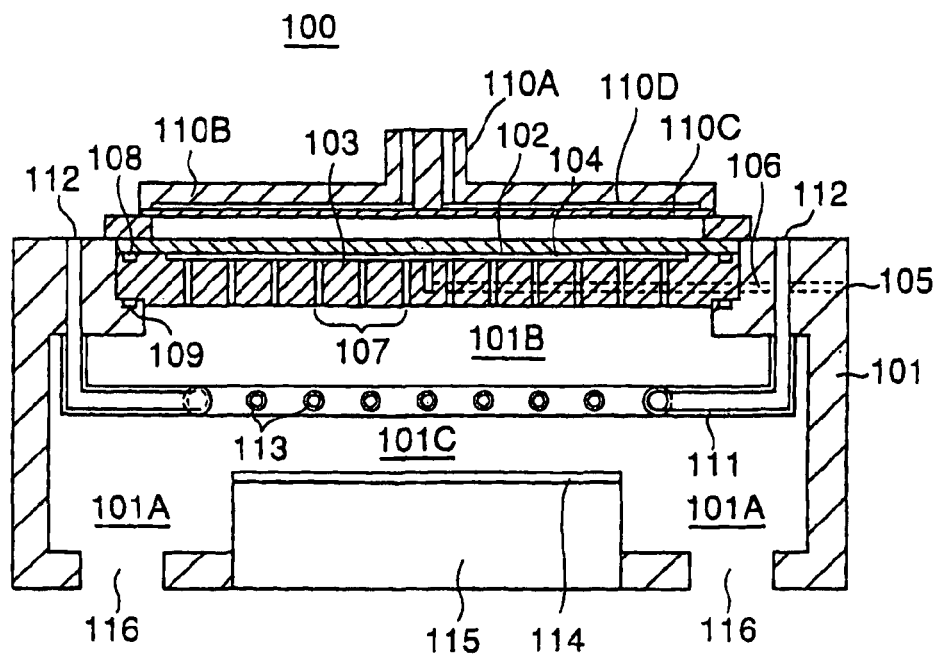
FIG. 5A is a schematic sectional view showing an example of the structure of a plasma processing apparatus for use in manufacturing a semiconductor device of this invention.
Figure 5B:
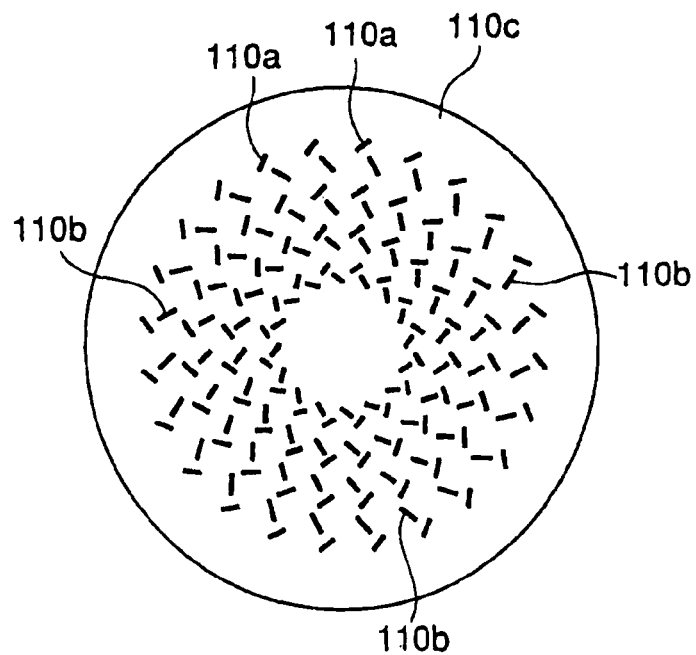
FIG. 5B is a plan view showing a planar antenna used in the plasma processing apparatus shown in FIG. 5A.

Referring to FIGS. 6 to 10, description will be given of a semiconductor device formed with a gate insulating film through an oxide film forming process and an oxide film reforming process each performed at a low temperature using a plasma according to the first embodiment of this invention. In this embodiment, the dual shower plate plasma processing apparatus using the radial line slot antenna shown in FIG. 5A is used in the oxide film forming process.

Figure 6:
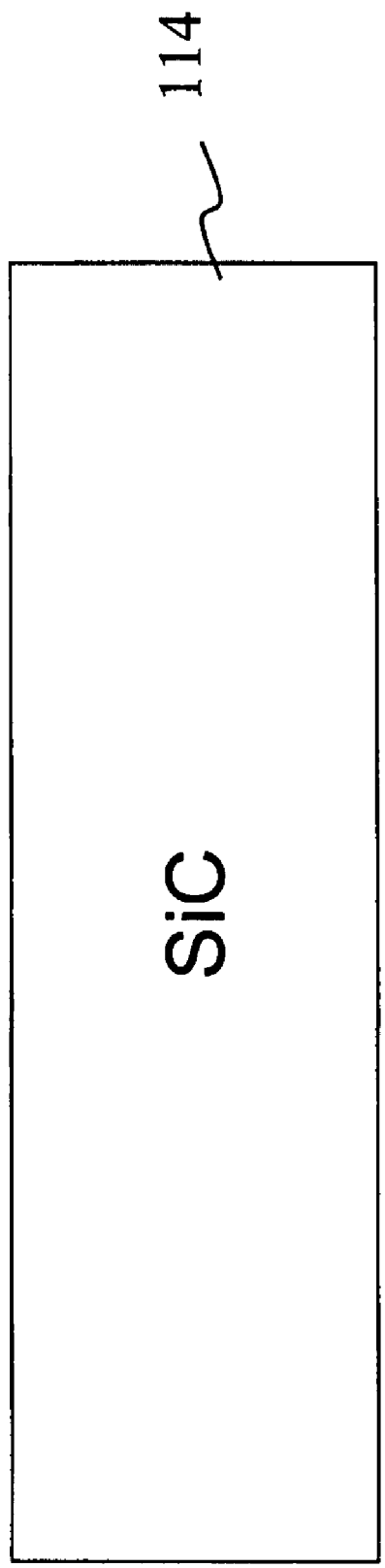
FIG. 6 is a diagram for explaining a preparation process of a SiC substrate in an oxide film forming process according to a first embodiment of this invention.

In this embodiment, at first, hydrogen terminating dangling bonds at the surface of a SiC substrate 114 shown in FIG. 6 is removed. More specifically, in this embodiment, using Kr for use as a plasma excitation gas in the next oxide film forming process, the surface-terminating hydrogen removal process and the oxide film forming process are continuously carried out in the same process chamber of FIG. 5A.

At first, the inside of the vacuum container 101 is evacuated in the plasma processing apparatus 100 of FIG. 5 and then an Ar gas is first introduced from the upper shower plate 103 and is then switched to a Kr gas. Further, the pressure in the vacuum container 101 is set to about 133 Pa (1 Torr).

Then, the SiC substrate 114 shown in FIG. 6 is placed on the holding stage 115. The SiC substrate 114 was subjected to dilute hydrofluoric acid cleaning in a pretreatment process immediately before. As a result, the SiC dangling bonds at the surface are terminated by hydrogen. As the SiC substrate 114, its surface may have any crystal structure and any plane orientation.

Subsequently, a microwave is introduced into the plasma generating space 101B in the vacuum container 101 from the radial line slot antenna 110C by the foregoing method. The introduced microwave excites the Kr gas introduced into the plasma generating space 101B from the shower plate 103. As a result, a high-density Kr plasma is uniformly formed in the plasma generating space 101B immediately under the shower plate. If the frequency of the supplied microwave falls within the range of about 900 MHz or more to about 10 GHz or less, the results will be substantially the same.

This embodiment shows the example in which the film formation is carried out by the use of the plasma apparatus using the radial line slot antenna 110C. However, another method may be used to introduce a microwave into a process chamber so as to excite a plasma. The plasma in the form of the excited Kr gas moves by diffusion into the plasma processing space 101C and thus the SiC substrate 114 on the holding stage 115 is exposed to the plasma. Thus, the surface thereof is subjected to low-energy Kr ion irradiation to remove its surface-terminating hydrogen.

Then, a $Kr/O_2$ mixed gas is introduced at 400/80 sccm from the upper shower plate 103 of FIG. 5. Simultaneously, a $SiH_4$ gas is introduced at 0.2 sccm from the lower shower plate 111. In this event, the pressure in the process chamber is maintained at about 133 Pa (1 Torr). The temperature is maintained at room temperature. In a high-density excited plasma in which the Kr gas and the $O_2$ gas are mixed together, Kr radicals and $O_2$ molecules in an intermediate excited state collide with each other, so that a large amount of atomic oxygen O radicals can be efficiently produced.

Figure 7:
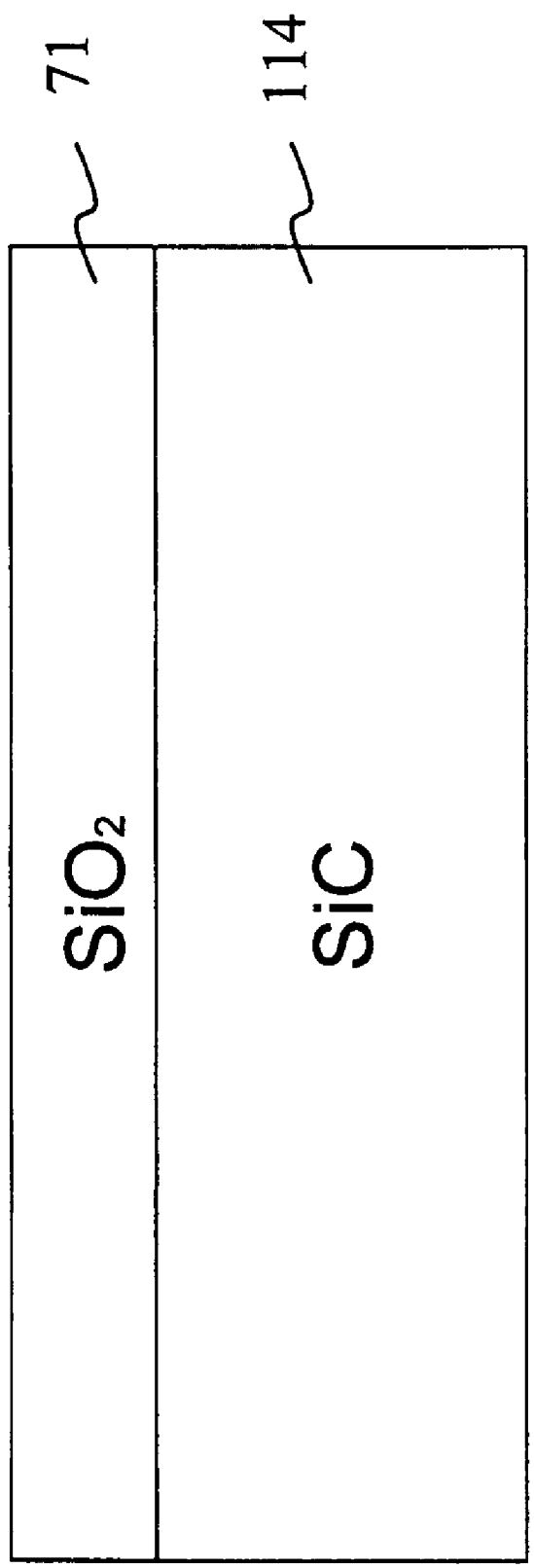
FIG. 7 is a diagram for explaining a process of forming a silicon oxide film on the SiC substrate.

In this embodiment, by a CVD reaction using the atomic oxygen O radicals and the $SiH_4$ gas, a silicon oxide film ($SiO_2$) 71 having a thickness of about 30 nm is formed by deposition on the surface of the SiC substrate 114 as shown in FIG. 7. In the conventional SiC-surface thermal oxidation method, oxidation is performed using $O_2$ molecules or $H_2O$ molecules and an extremely high processing temperature of 1,200° C. or more is required. On the other hand, in the oxidation process using the atomic oxygen O radicals according to this invention, the oxide film formation is enabled at a very low temperature, i.e. room temperature.

Figure 8:
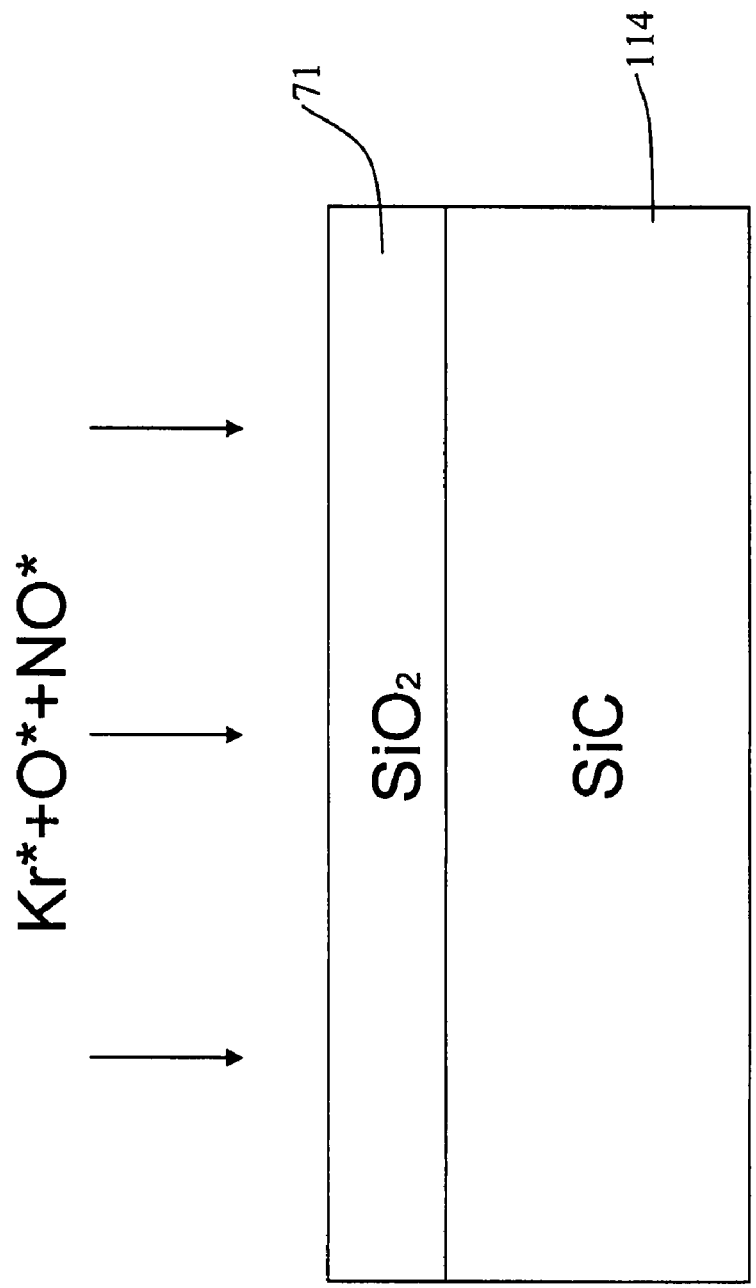
FIG. 8 is a diagram for explaining a process of improving the film quality of the silicon oxide film.
Figure 9:
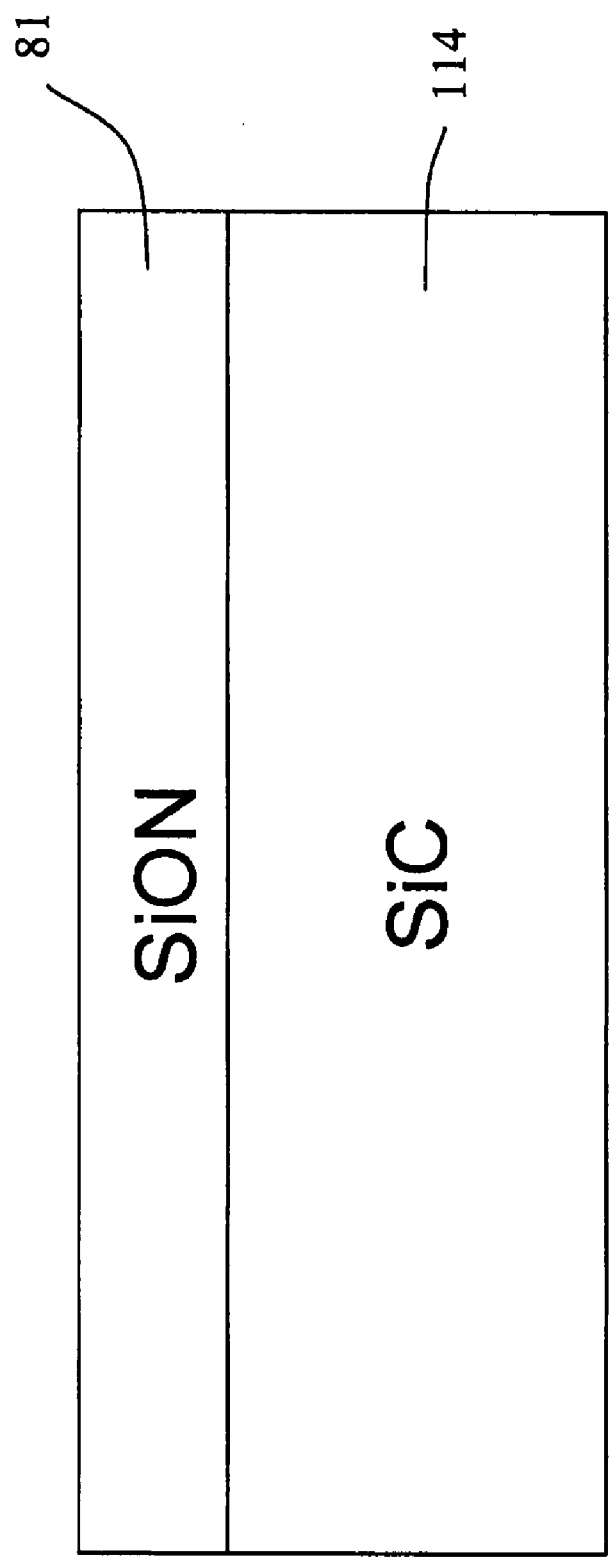
FIG. 9 is a diagram for explaining a reformed insulating film.

Upon the formation of the silicon oxide film 71 having the predetermined thickness, the introduction of the microwave power is once stopped to finish the plasma excitation and the introduction of the $O_2$ gas and the $SiH_4$ gas is stopped. Further, after purging the inside of the vacuum container 101 with Kr, a $Kr/O_2/NO$ mixed gas is introduced at 1000/30/0.001 sccm from the upper shower plate. While setting the pressure in the vacuum container 101 at about 133 Pa (1 Torr) and the temperature of the SiC substrate 114 at 600° C., a microwave is again supplied so as to generate a high-density plasma in the vacuum container 101. In this manner, the film quality of the silicon oxide film 71 is improved as shown in FIG. 8. As a result, an insulating film 81 in the form of an oxynitride film (SiON) is finally obtained, as shown in FIG. 9. The processing time of the oxide film reforming process is 3 minutes while the thickness of the insulating film 81 is about 30 nm in terms of EOT.

Then, the introduction of the microwave power is stopped to finish the plasma excitation upon the formation of the reformed insulating film 81 and, further, the $Kr/O_2/NO$ mixed gas is replaced with an Ar gas. Thus, the oxide film reforming process is finished. The reason for using the Ar gas before and after this process is to use a gas cheaper than Kr as a purge gas. The Kr gas used in this process is recovered and reused. Thereafter, in a heat treatment furnace, heat treatment is carried out in an Ar gas atmosphere at 1,100° C. for 3 hours.

Figure 10:
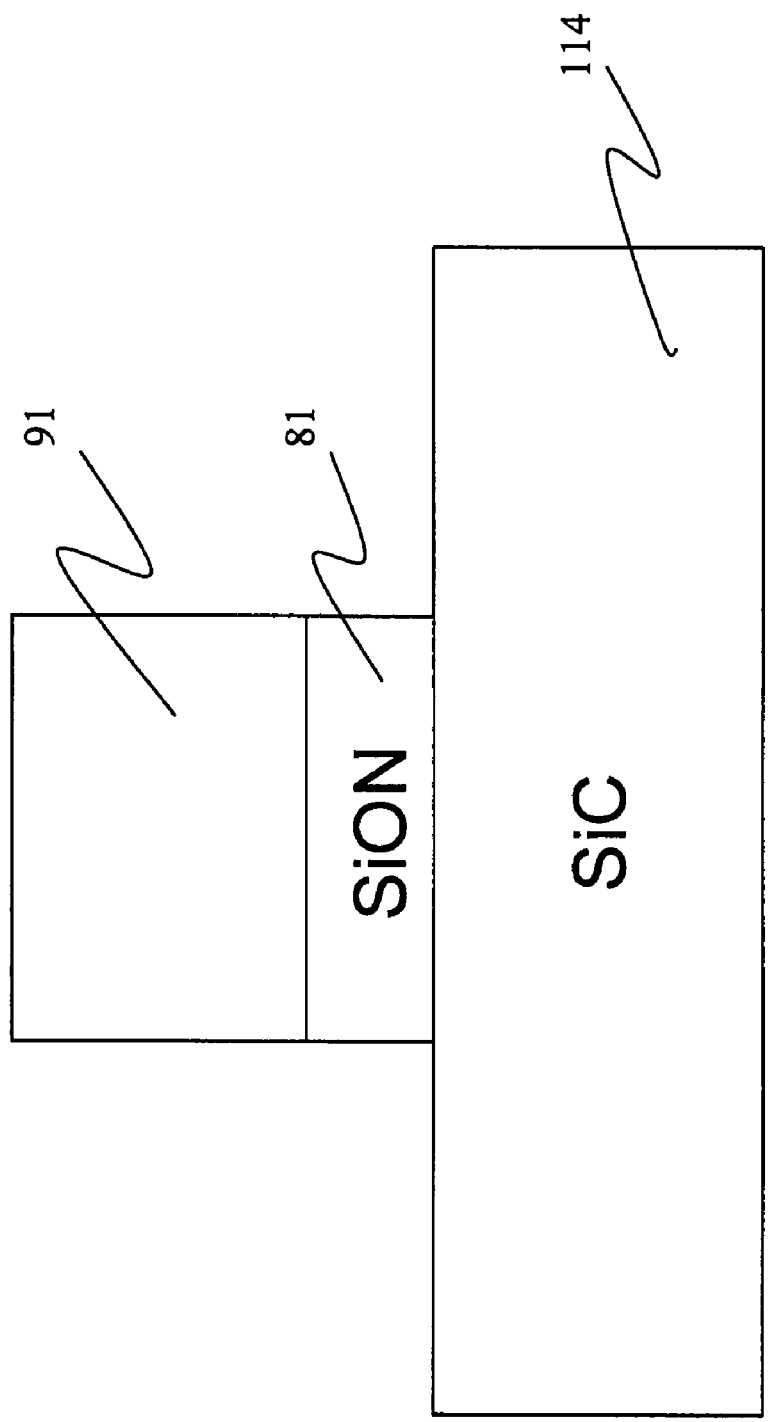
FIG. 10 is a diagram showing a gate electrode forming process that is performed after the reformation of the insulating film.

Subsequently to the foregoing gate insulating film forming process, by using, as a gate insulating film, the insulating film 81 in the form of the oxynitride film obtained through the foregoing processes, polysilicon is deposited thereon as a gate electrode 91 as shown in FIG. 10. Then, by performing a patterning process, an ion implantation process, a protective film forming process, a wiring layer forming process, a hydrogen sintering process, and so on, it is possible to form a semiconductor integrated circuit including transistors and capacitors.

In the foregoing description, for simplification of the processes, the insulating film reforming process uses the same dual shower plate plasma processing apparatus of FIG. 5A as the insulating film forming process. However, the insulating film reforming process may, of course, be carried out using the single shower plate plasma processing apparatus described before.

Figure 11:
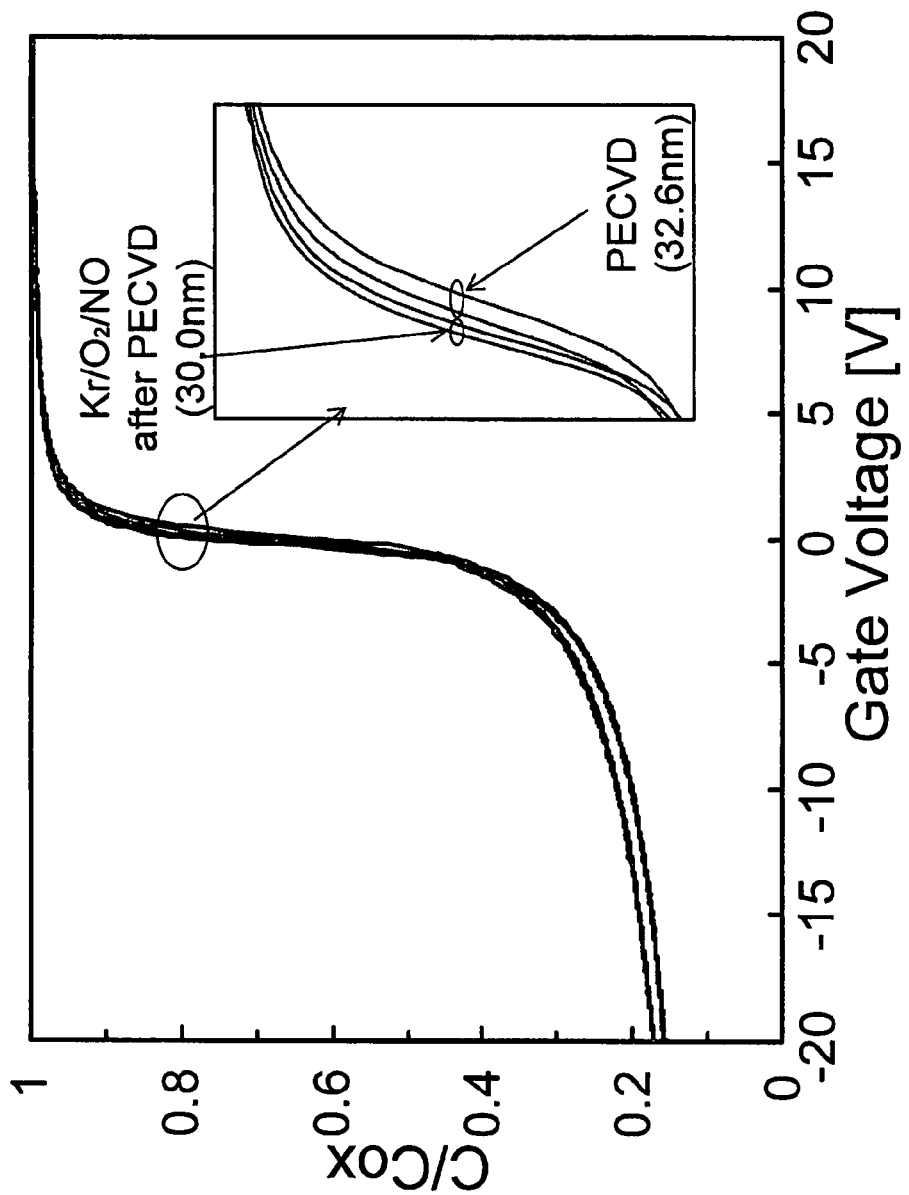
FIG. 11 is a graph for explaining the characteristics of a MOS capacitor having a gate insulating film obtained by the foregoing insulating film forming process by comparison with the characteristics of a MOS capacitor obtained by another process.

FIG. 11 shows the high-frequency CV characteristics of a MOS capacitor having a gate insulating film formed by the foregoing insulating film forming method. As a comparison, there are shown the characteristics of a MOS capacitor having a CVD oxide film not subjected to a surface treatment using a NO gas.

Referring to FIG. 11, the CV characteristics of the MOS capacitor having the gate insulating film formed by the insulating film forming method according to this invention are hardly shifted and the hysteresis width thereof is also small, thus exhibiting the characteristics close to ideal values. Since the shift and the hysteresis width of the CV characteristics are small even in comparison with the CVD oxide film not subjected to the surface treatment using the NO gas, it is understood that the gate insulating film/SiC interface characteristics are improved by the insulating film reforming process.

Figure 12:
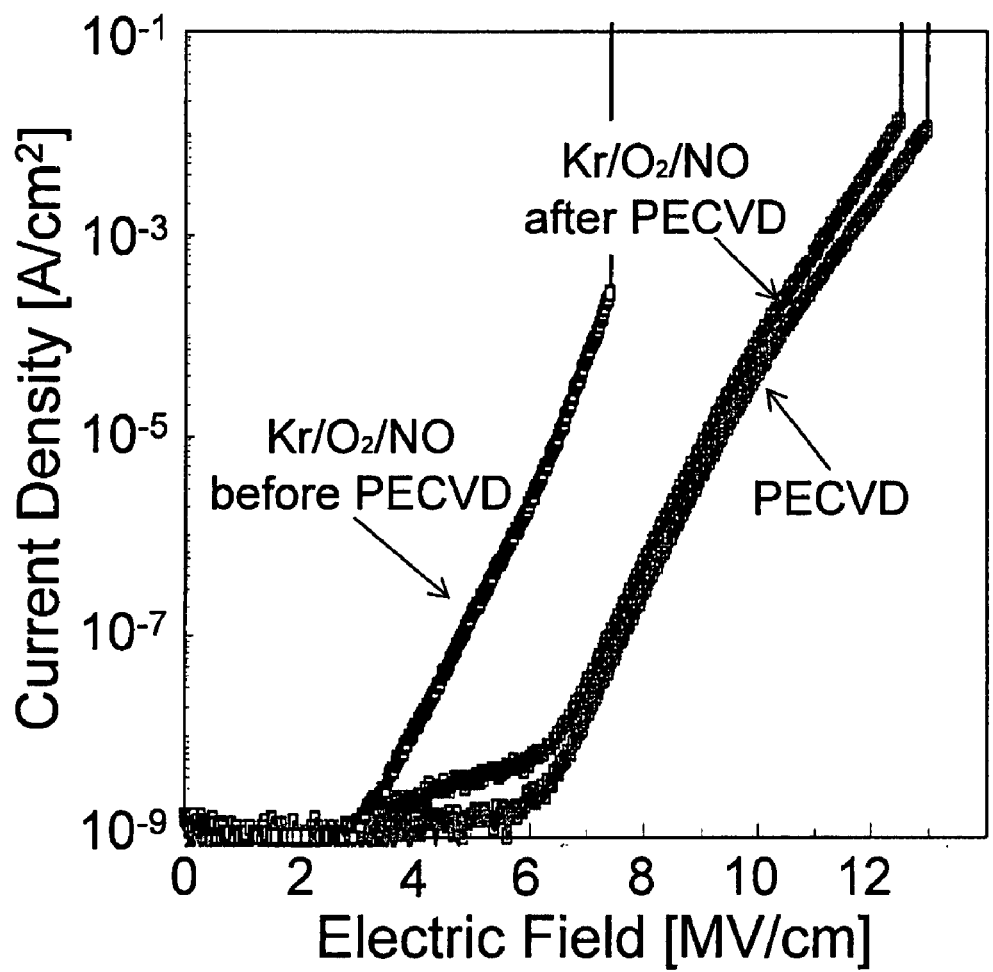
FIG. 12 is a graph for explaining the JE characteristics of a MOS capacitor having a gate insulating film obtained by the foregoing insulating film forming process by comparison with the JE characteristics of other MOS capacitors.

FIG. 12 shows the JE characteristics of a MOS capacitor having a gate insulating film formed by the foregoing insulating film forming method. As a comparison, there are shown the characteristics of a MOS capacitor having a CVD oxide film not subjected to a surface treatment using a NO gas and of a MOS capacitor having a gate insulating film obtained by directly radical-oxynitriding the SiC surface using a $Kr/O_2/NO$ mixed gas, performing a heat treatment in an Ar gas atmosphere at 1,100° C., and then depositing a CVD oxide film.

Referring to FIG. 12, the dielectric breakdown electric field of the insulating film obtained by directly radical-oxynitriding the SiC surface is less than 8 MV/cm. On the other hand, in the case of the gate insulating film formed by the foregoing insulating film forming method, it is improved to 12 MV/cm or more.

Figure 13:
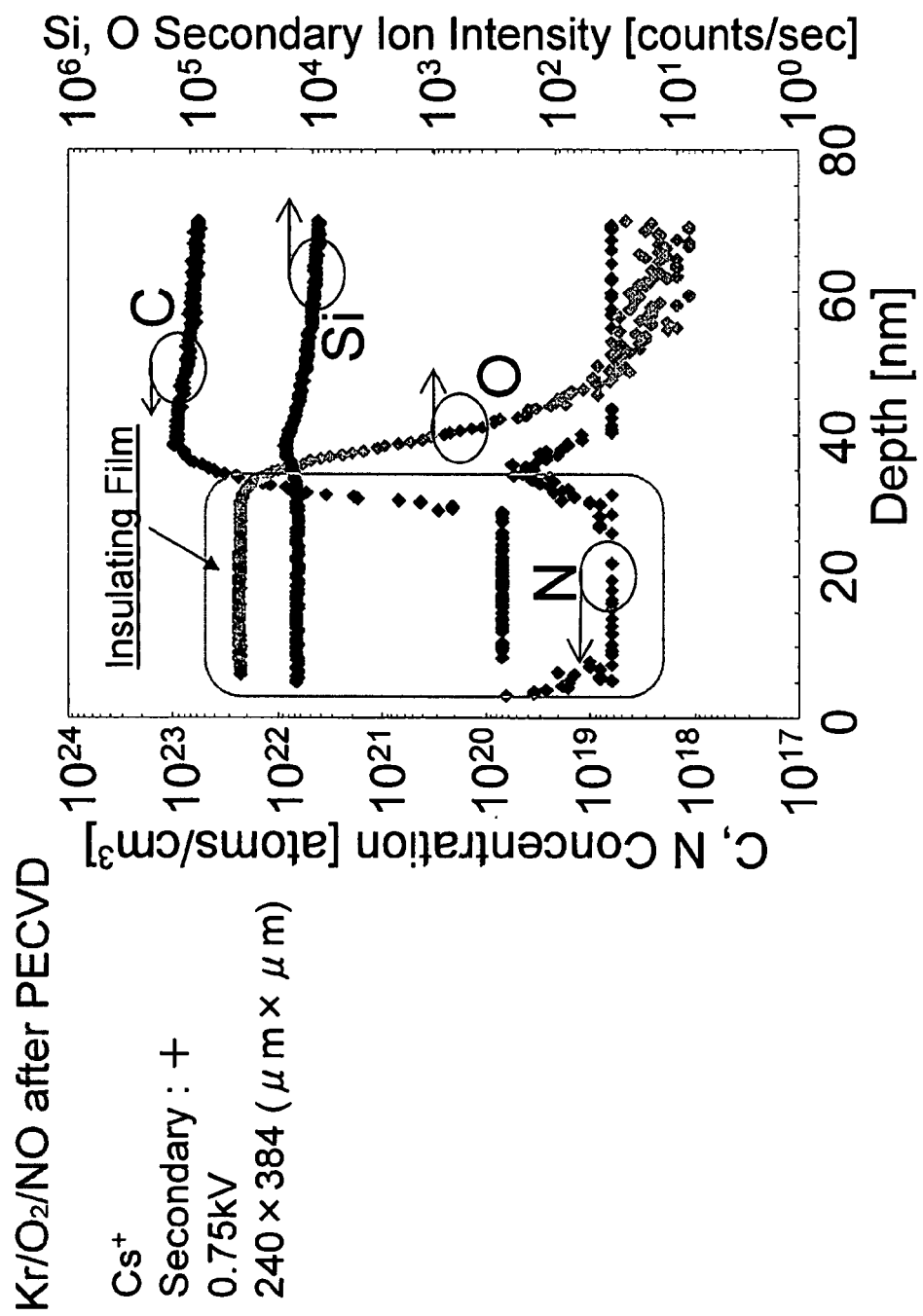
FIG. 13 is a diagram showing the carbon content in the gate insulating film obtained by the foregoing insulating film forming process and in the SiC substrate.

FIG. 13 shows the carbon content in the gate insulating film formed by the foregoing insulating film forming method and in the SiC substrate.

Figure 2:
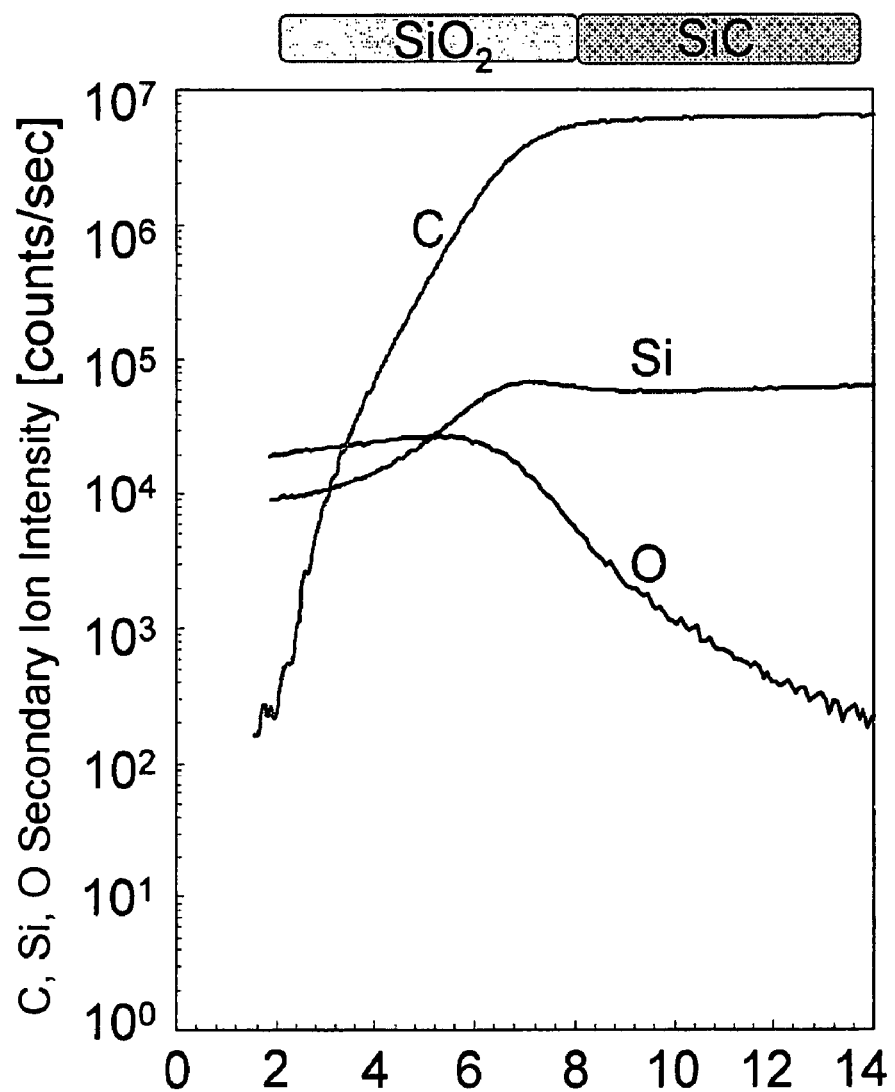
FIG. 2 is a diagram showing the depth-direction distribution of carbon present in the gate insulating film obtained by directly radical-oxidizing the SiC surface.
Figure 3:
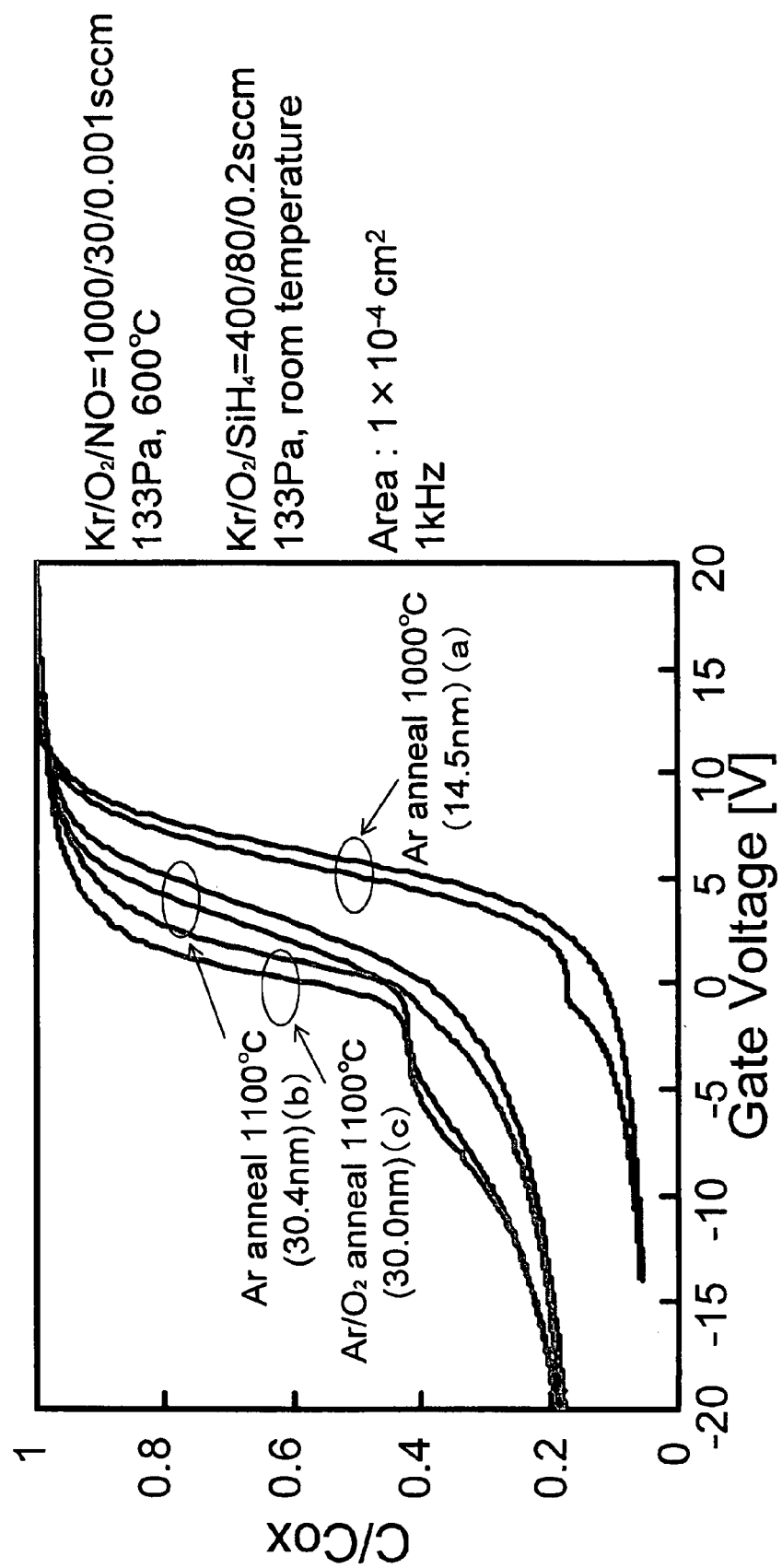
FIG. 3 is a graph showing the high-frequency CV characteristics of MOS transistors each having a gate oxide film obtained by annealing an oxynitride film obtained by directly oxynitriding the SiC surface.
Figure 4A:
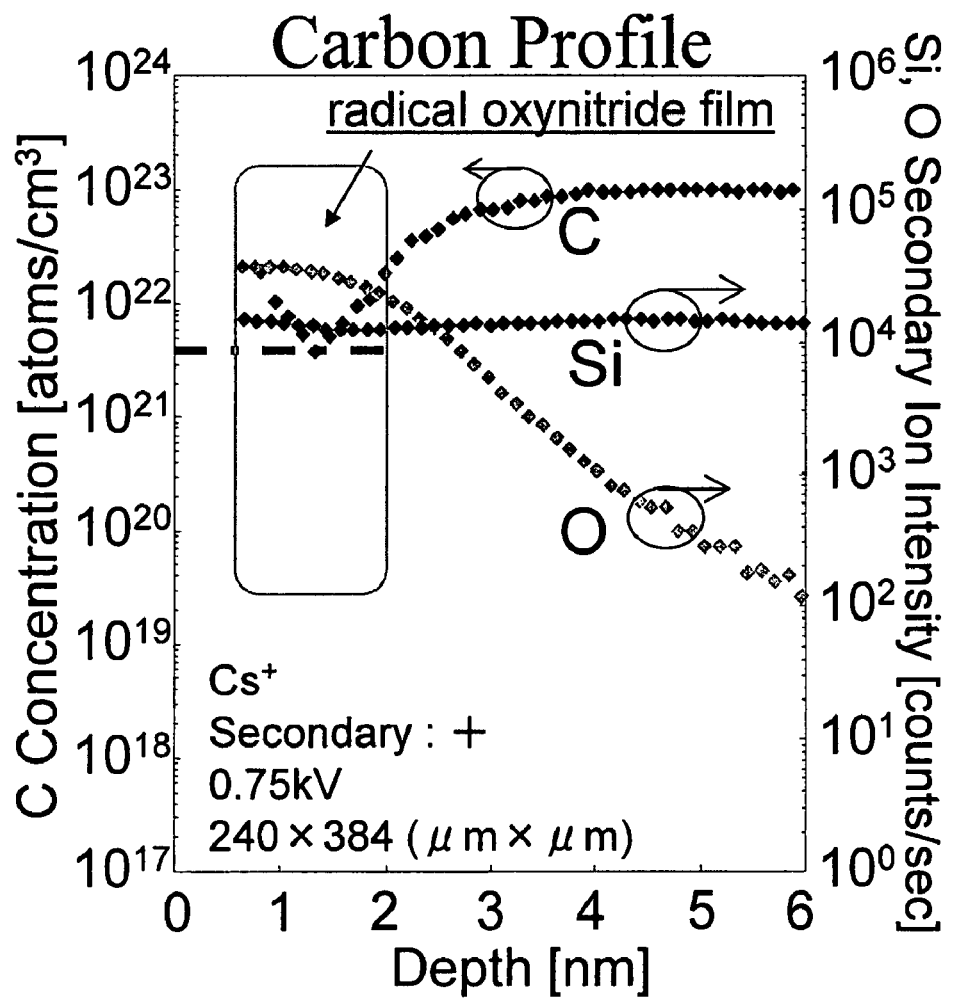
FIG. 4A is a graph showing the results of measuring the depth-direction concentration of carbon in the MOS transistor having the gate oxide film shown in FIG. 3.
Figures 4B, 4C:
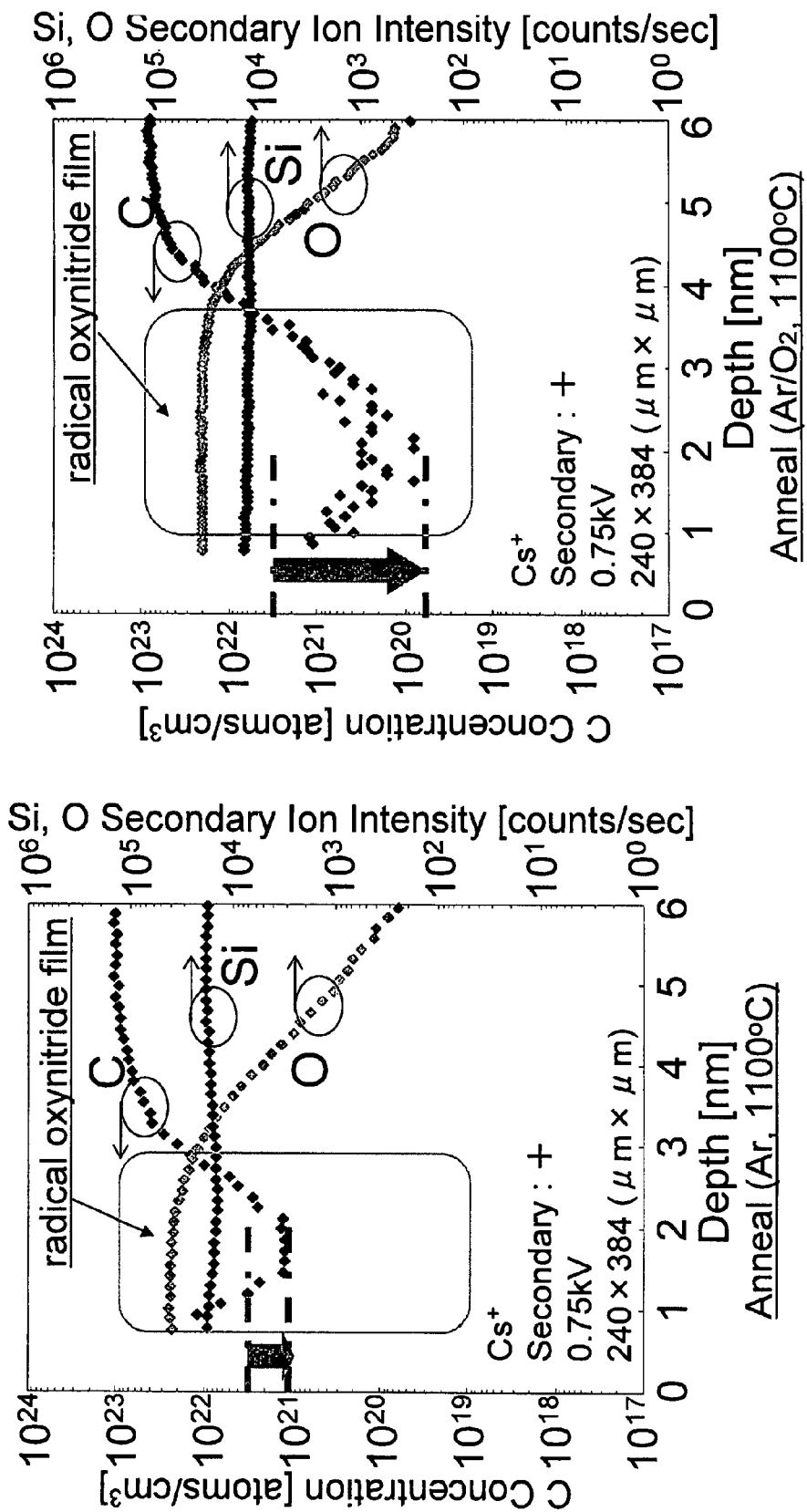
FIG. 4B is a graph showing the results of measuring the depth-direction concentration of carbon in the MOS transistor having another gate oxide film shown in FIG. 3.
FIG. 4C is a graph showing the results of measuring the depth-direction concentration of carbon in the MOS transistor having still another gate oxide film shown in FIG. 3.

Referring to FIG. 13, it is seen that the carbon content in the insulating film is less than $1 \times 10^{20}$ atoms/cm$^3$ and is equal to or less than a detection limit of about $6 \times 10^{19}$ atoms/cm$^3$. Further, it has also been confirmed that the carbon content decreases far more sharply as compared with the case of FIG. 2 or 4 in a portion near the SiC interface of the gate insulating film.

Figure 15:
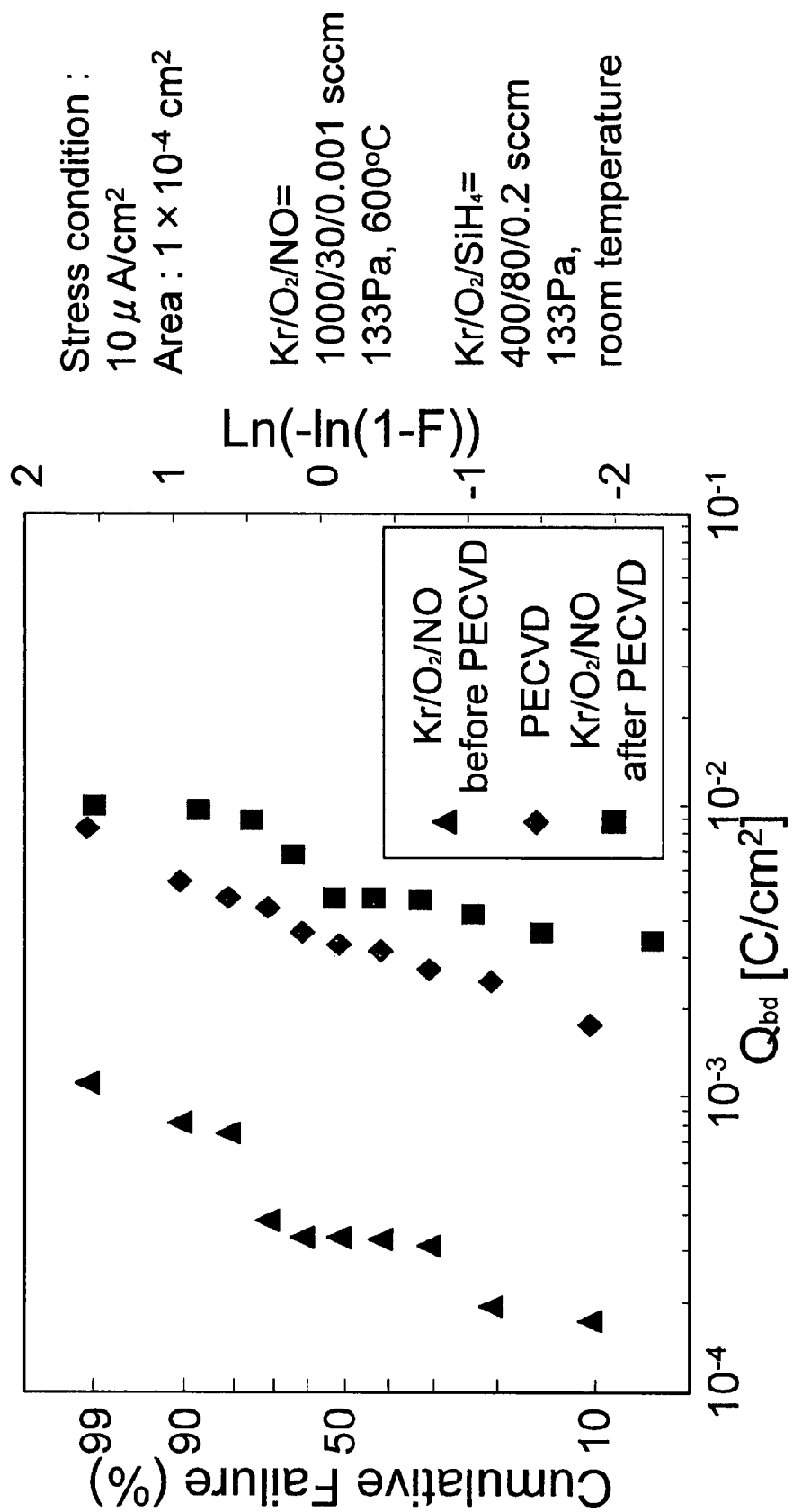
FIG. 15 is a diagram for explaining the stress resistance of the gate insulating film obtained by the foregoing insulating film forming process.
Figure 16:
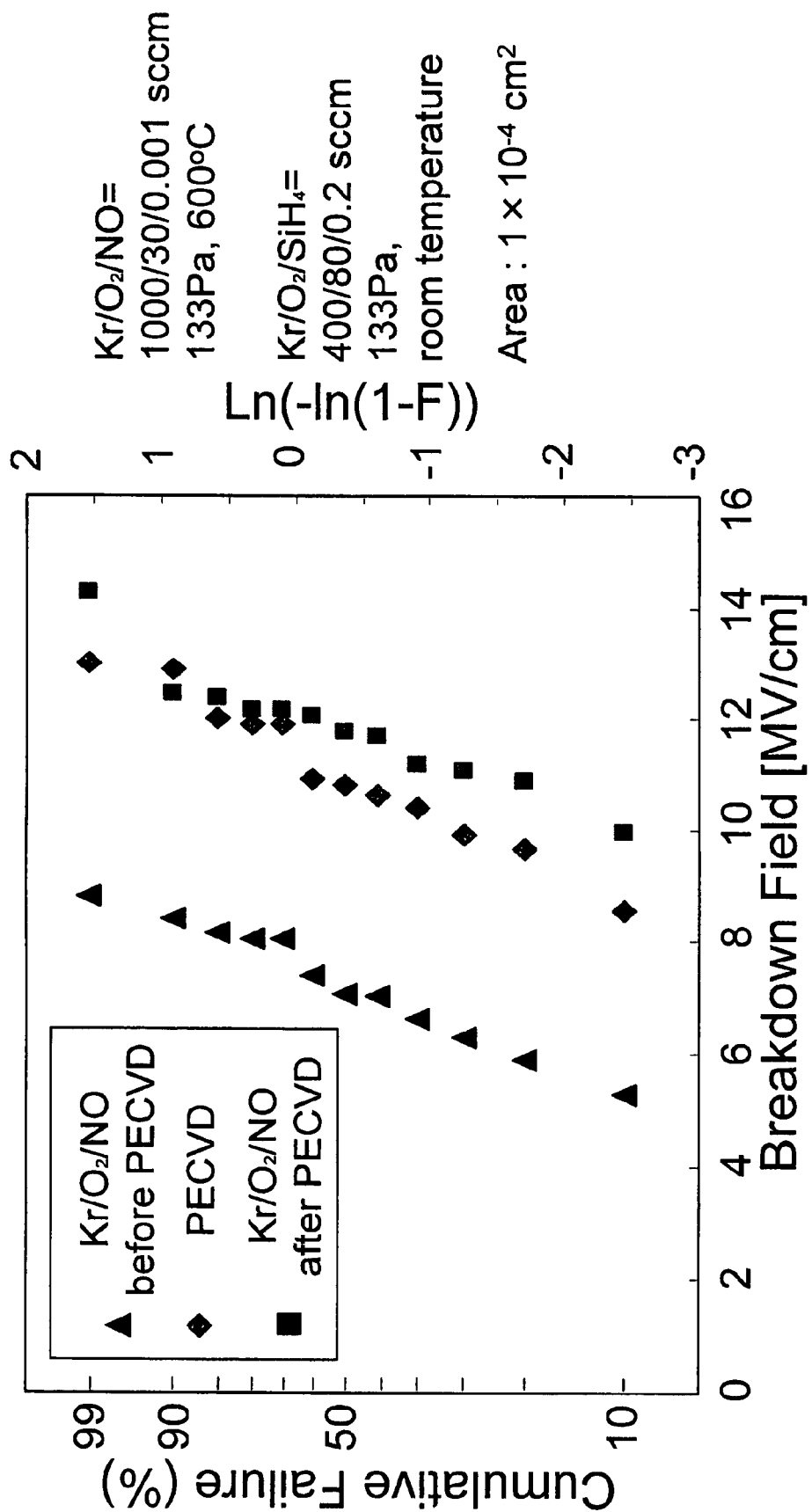
FIG. 16 is a diagram for explaining the breakdown characteristics of the gate insulating film obtained by the foregoing insulating film forming process.

While it is seen from FIGS. 12 and 13 that the gate insulating film with no carbon present therein has higher voltage resistance in the dielectric breakdown electric field as compared with the insulating film formed by directly reacting the SiC surface, superiority of the insulating film of this invention is made clear by referring to FIGS. 14 to 16.

FIG. 14 shows the oxide fixed charge and interface trap density of the gate insulating film formed by the foregoing insulating film forming method. As a comparison, there are shown the characteristics of a gate insulating film obtained by directly radical-oxynitriding the SiC surface using a $Kr/O_2/NO$ mixed gas, performing a heat treatment in an Ar gas atmosphere at 1,100° C., and then depositing a CVD oxide film and the characteristics of a CVD oxide film not subjected to a surface treatment using a NO gas.

Referring to FIG. 14, it is seen that, according to this invention, the oxide fixed charge and the interface trap density take remarkably low values of $2.23 \times 10^9$ cm$^{-2}$ and $3.34 \times 10^{10}$ cm$^{-2}$, respectively, and are improved by about one to two digits, respectively. Accordingly, this invention for the first time makes it possible to realize a SiC device having a gate insulating film with a carbon content of $1 \times 10^{20}$ atoms/cm$^3$, an oxide fixed charge of $1 \times 10^{11}$ cm$^{-2}$ or less, and an interface trap density of also $1 \times 10^{11}$ cm$^{-2}$ or less. If the carbon content exceeds $1 \times 10^{20}$ atoms/cm$^3$, it is difficult to achieve the oxide fixed charge of $1 \times 10^{11}$ cm$^{-2}$ or less and the interface trap density of also $1 \times 10^{11}$ cm$^{-2}$ or less. Further, it has been found that if the oxide fixed charge exceeds $1 \times 10^{11}$ cm$^{-2}$ and the interface trap density exceeds $1 \times 10^{11}$ cm$^{-2}$, it is impossible to obtain a SiC device with almost no hysteresis and with high voltage resistance.

FIGS. 15 and 16 show the stress resistance of the gate insulating film formed by the foregoing insulating film forming method. As a comparison, there are shown the characteristics of two insulating films which are the same as those in the case of FIG. 14. From FIGS. 15 and 16, it is seen that the stress resistance of the gate insulating film of this invention is also excellent.

Figure 17:
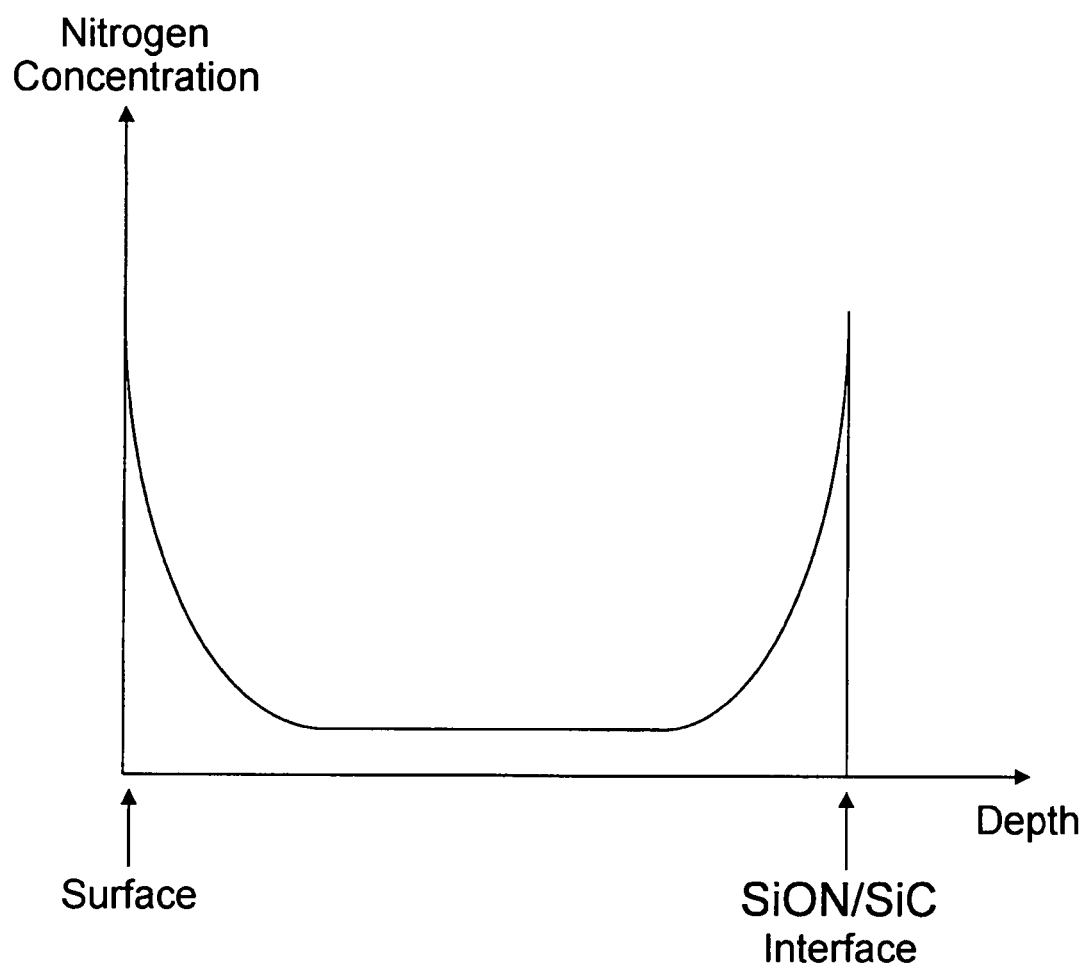
FIG. 17 is a diagram for explaining the nitrogen distribution in the gate insulating film obtained by the foregoing insulating film forming process.

FIG. 17 schematically shows a nitrogen distribution profile in the gate insulting film (oxynitride film) formed by the foregoing insulating film forming method.

Referring to FIG. 17, nitrogen is concentrated at the surface of the oxynitride film and at the interface between the oxynitride film and the underlying SiC substrate. As a result, although the oxynitride film has a composition of an oxynitride film on the whole, a middle portion thereof in the film thickness direction has a composition near an oxide film, while, the surface thereof and the interface between the oxynitride film and the SiC substrate have a composition near a nitride film.

Although krypton (Kr) is used as an inert gas in the foregoing embodiment, argon (Ar), xenon (Xe), or a mixture with them may be used. Particularly, a combination of an oxygen gas and krypton (Kr) is preferable. This is because oxygen radicals and krypton (Kr) during film formation remain in a formed oxide film, so that the properties (insulating properties, interface properties) for the insulating film are improved.

Further, in the foregoing embodiment, $SiO_2$ is formed by PECVD and is then reformed by the plasma of the mixed gas of Kr, oxygen, and NO. In this manner, the SiON film is obtained. On the other hand, instead of the NO gas, use may be made of an ammonia gas, a nitrogen gas, or a mixed gas thereof. Further, $SiO_2$ formed by PECVD may be reformed by a plasma of a mixed gas of an inert gas and a nitrogen gas or an ammonia gas, or may be reformed by a plasma of a mixed gas of an inert gas, a nitrogen gas, and a hydrogen gas. If reformed by $NH_3$ radicals, a SiON film can be obtained. If reformed by N radicals, there can be obtained a $SiO_2$ film of which the surface is converted to a SiON film. A plasma may be generated using a nitrogen gas without using an inert gas. On the other hand, a SiON film may be formed by PECVD and then reformed by a plasma of a mixed gas of an inert gas and a gas containing nitrogen atoms. In any event, the obtained SiON film is a film with low carbon content, small hysteresis, small Vbf shift, and high voltage resistance.

Second Embodiment

Next, referring to schematic sectional structural views shown in FIGS. 18 to 20, description will be given of a semiconductor element according to the second embodiment of this invention using the foregoing oxynitride film forming technique at the low temperature using the plasma.

Figure 20:
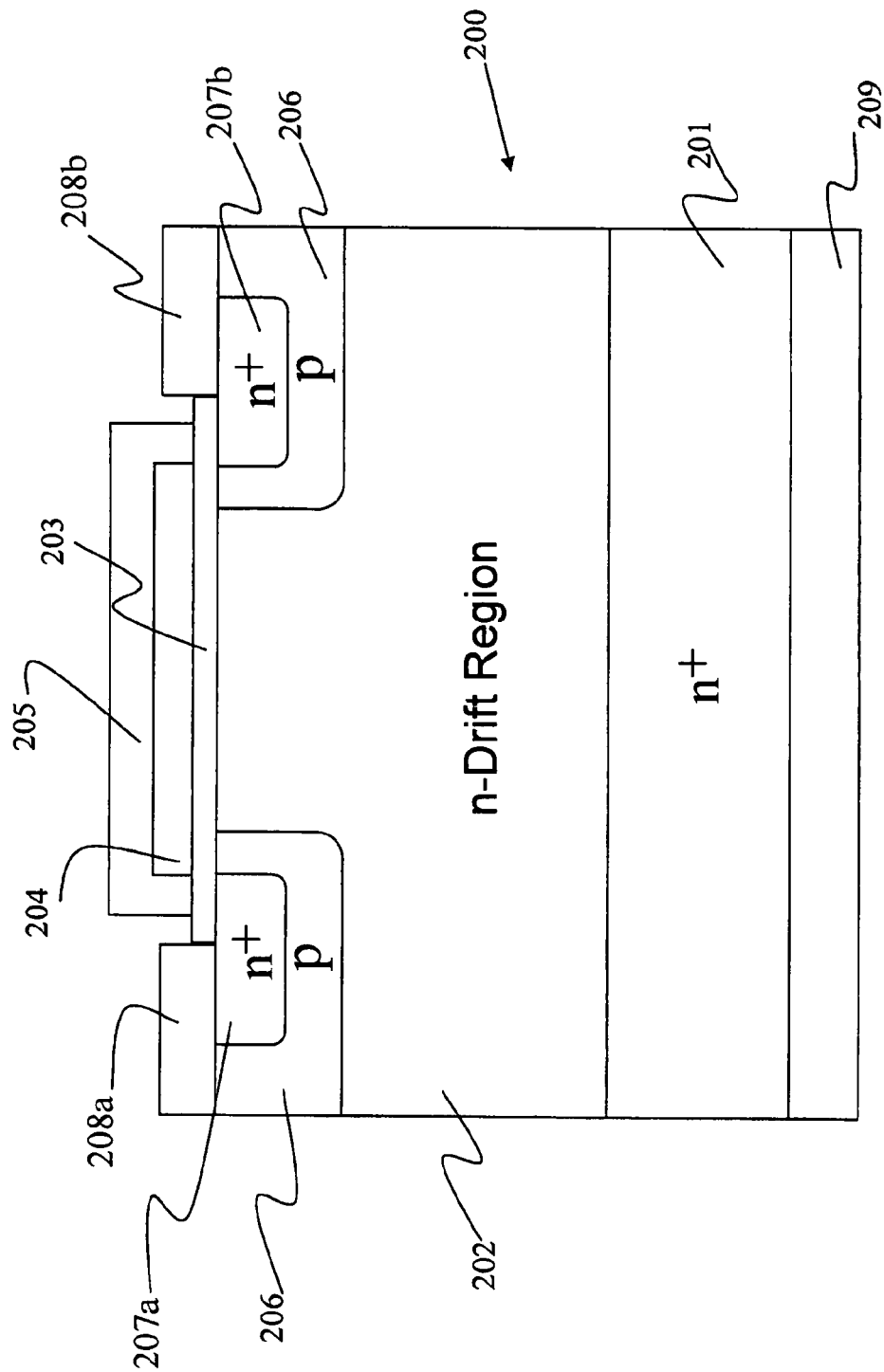
FIG. 20 is a diagram showing a schematic structure of the semiconductor element obtained according to the second embodiment of this invention.

Referring to FIG. 20, the semiconductor element is formed on a SiC substrate 200 which may have any crystal structure and any plane orientation. In this embodiment, use is made of the SiC substrate 200 in which an n-type region with a carrier concentration of about $10^{16}$ cm$^{-3}$ and a thickness of 15 μm is epitaxially grown as an n-drift region 202 on a SiC base 201.

The semiconductor element comprises a gate insulating film 203 formed on the SiC substrate 200, a gate electrode 204 formed on a channel region and the n-drift region 202 through the gate insulating film 203, an insulating layer 205 formed so as to cover the gate electrode 204, p regions 206, an n+ source region 207a, the n-drift region 202, an n+ drain region 207b, a source electrode 208a, and a drain electrode 209b. The gate insulating film 203 is formed by the silicon oxynitride film forming method described in the first embodiment.

Figure 18:
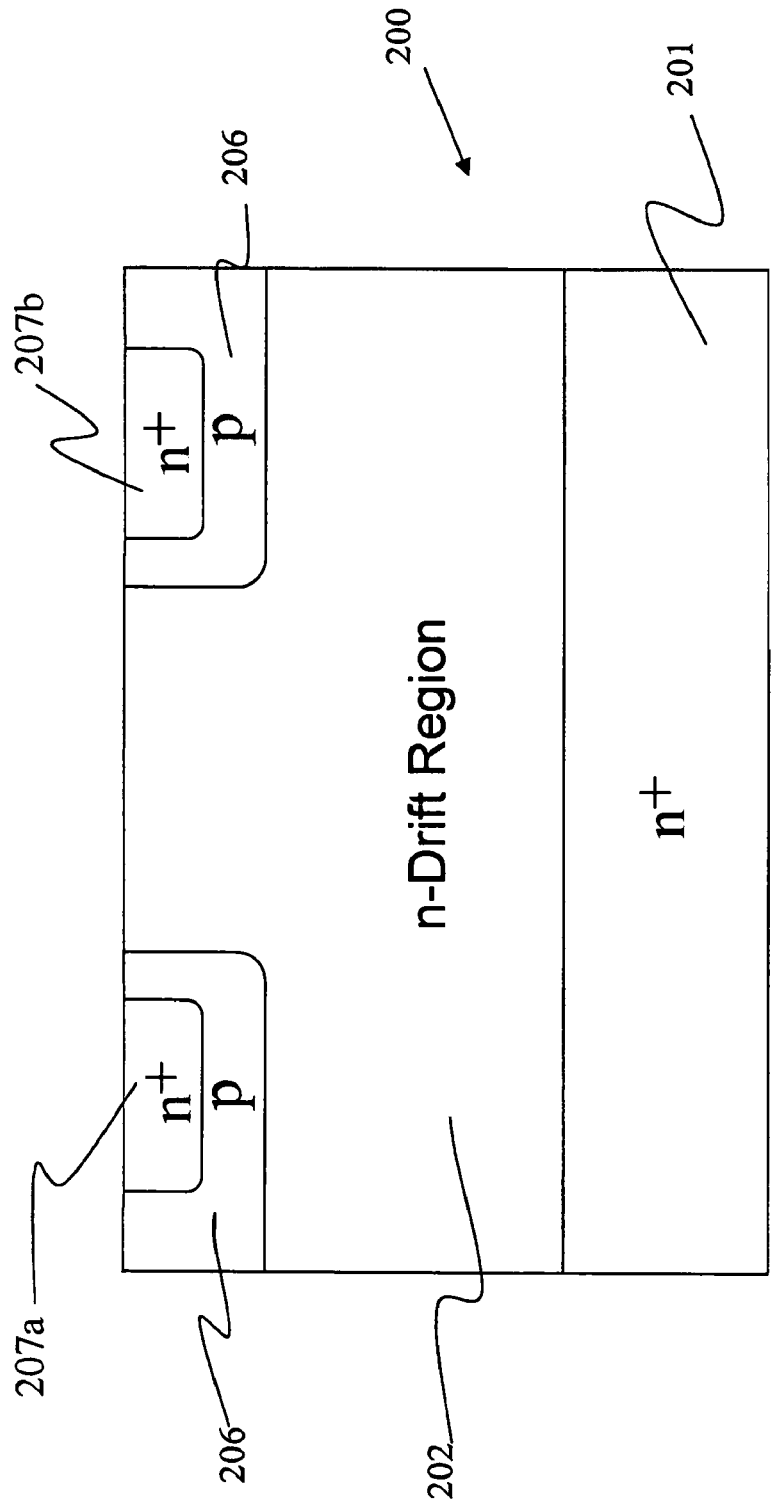
FIG. 18 is a diagram showing one process of a manufacturing method of a semiconductor element according to a second embodiment of this invention.
Figure 19:
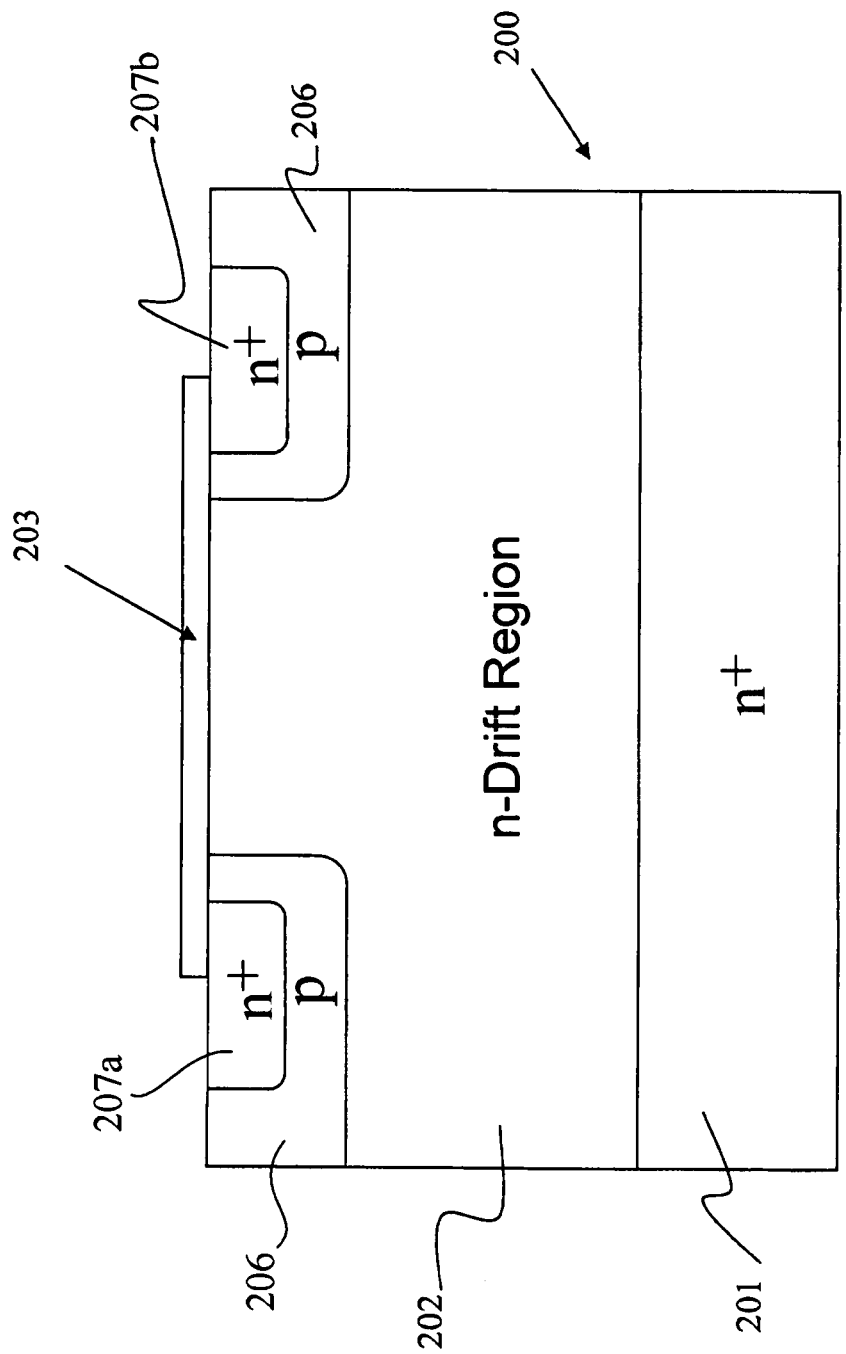
FIG. 19 is a diagram showing a process carried out after the process of FIG. 18.

FIGS. 18 and 19 are schematic sectional views for explaining, in stages, a manufacturing method of the semiconductor element of this embodiment.

In the process of FIG. 18, the p regions 206 and the n+ source region 207 are formed. The p regions 206 and the n+ source region 207 are formed by ion-implanting Al and N into the SiC substrate 200, respectively. In this embodiment, Al is ion-implanted so as to obtain a carrier concentration of about $10^{18}$ cm$^{-3}$ and a thickness of 1 μm while N is ion-implanted so as to obtain a carrier concentration of about $10^{19}$ cm$^{-3}$ and a thickness of 0.3 μm. In order to reduce the sheet resistance, the temperature of the substrate is set to 500° C. or more upon the ion implantation. Thereafter, an Ar gas is introduced to perform activation annealing at 1500° C. for 60 minutes.

In this embodiment, Kr is used as a plasma excitation gas for surface-terminating hydrogen removal and oxynitride film formation. An oxynitride film forming apparatus is the same as in FIG. 5.

Then, in the process of FIG. 19, after sacrificial oxidation of the surface of the SiC substrate 200, a sacrificial oxide film is removed and the SiC surface is terminated with hydrogen by dilute hydrofluoric acid cleaning. Further, in the same manner as in the foregoing first embodiment, the gate insulating film 203 is formed. In this embodiment, the channel length is set to 2 μm.

Specifically, in the same manner as in the foregoing first embodiment, the inside of the vacuum container 101 (process chamber) is evacuated and then an Ar gas is first introduced from the upper shower plate 103 and is then switched to a Kr gas. Further, the pressure in the vacuum container 101 (process chamber) is set to about 133 Pa (1 Torr).

Then, the SiC substrate 200 is placed on the substrate holding stage 115 (see FIG. 5). A microwave is supplied to the radial line slot antenna 110C from the coaxial waveguide (guide pipe 110A). The microwave is introduced into the process chamber (vacuum container 101) from the radial line slot antenna 110C through the dielectric plate 102 and the upper shower plate 103. By exposing the SiC substrate 200 to a plasma in the form of the excited Kr gas, the surface of the SiC substrate 200 is subjected to low-energy Kr ion irradiation. In this manner, its surface-terminating hydrogen is removed.

Then, a $Kr/O_2$ mixed gas is introduced at 400/80 sccm from the upper shower plate 103. Further, a $SiH_4$ gas is introduced at 0.2 sccm from the lower shower plate 111. In this event, the pressure in the process chamber (vacuum container 101) is maintained at about 133 Pa (1 Torr). Upon formation of a silicon oxide film having a desired thickness, the introduction of the microwave power is once stopped to finish the plasma excitation and the introduction of the $O_2$ gas and the $SiH_4$ gas is stopped. Further, after purging the inside of the process chamber (vacuum container 101) with Kr, a $Kr/O_2/NO$ mixed gas is introduced at 1000/30/0.001 sccm from the upper shower plate 103. While setting the pressure in the process chamber (vacuum container 101) at about 133 Pa (1 Torr), a microwave is again supplied so as to generate a high-density plasma in the process chamber (vacuum container 101). Thus, the film quality of the silicon oxide film is improved to finally obtain an oxynitride film (gate insulating film 203).

The processing time of the oxide film reforming process is set to 3 minutes while the thickness of the gate insulating film 203 is set to about 30 nm. Then, the introduction of the microwave power is stopped to finish the plasma excitation upon the formation of the gate insulating film 203 having the desired film quality. Further, the $Kr/O_2/NO$ mixed gas is replaced with an Ar gas. In this manner, the oxide film reforming process is finished. Thereafter, in a heat treatment furnace, heat treatment is carried out in an Ar gas atmosphere at 1,100° C. for 3 hours.

Then, as shown in FIG. 20, a polysilicon layer (gate electrode 204) is deposited on the gate insulating film 203. The film thickness is set to 500 nm. Thereafter, in accordance with the standard semiconductor processes, the insulating layer 205 is formed so as to cover the polysilicon layer (gate insulating film 204). Further, Al is deposited on the n+ source region 207a and the n+ drain region 207b to form the source electrode 208a and the drain electrode 208b each having a thickness of 1 μm and so on. Thus, the element is completed.

The semiconductor device manufactured as described above has the insulating film excellent in any plane orientation and can suppress an increase in interface trap, thus having the excellent device properties.

While the embodiments and examples of this invention have been described above, this invention is not to be limited thereto, but can be modified within the range of technical thought as defined in claims.

What is claimed is:

1. A method of manufacturing a semiconductor device, comprising the steps of:
    forming a gate insulating film on a surface of a semiconductor region containing SiC as a main component; and
    forming a gate electrode on the gate insulating film,
    wherein the step of forming the gate insulating film includes;
    a first step of depositing a first film made of at least one of a silicon oxide and a silicon oxynitride on the surface of the semiconductor region containing the SiC as the main component, and
    a second step of exposing the first film to radicals containing at least nitrogen atoms in order to introduce the nitrogen atoms into the first film.

2. A method of manufacturing the semiconductor device according to claim 1, wherein the second step is a step of reforming the first film with oxygen radicals and radicals containing nitrogen atoms.

3. A method of manufacturing the semiconductor device according to claim 1, wherein the first film is a silicon oxide film.

4. A method of manufacturing the semiconductor device according to claim 1, wherein the first film is a silicon oxynitride film.

5. A method of manufacturing the semiconductor device according to claim 1, wherein the radicals containing the nitrogen atoms are at least one of nitrogen radicals, NO radicals, and $NH_3$ radicals.

6. A method of manufacturing the semiconductor device according to claim 1, wherein a thickness of the first firm is set to 5 to 50 nm.

7. A method of manufacturing the semiconductor device according to claim 1, wherein the second step further comprises a step of forming the radicals containing the nitrogen atoms from a gas containing at least nitrogen using a microwave-excited plasma.

8. A method of manufacturing the semiconductor device according to claim 1, wherein the first step comprises the steps of generating a microwave-excited plasma, introducing a film forming gas into the plasma, and thereby forming the film of at least one of the silicon oxide and the silicon oxynitride by CVD.

9. A method of manufacturing the semiconductor device according to claim 7, wherein:
    the microwave-excited plasma is generated in a process chamber using a plasma processing apparatus comprising:
        a holding stage for holding a substantially flat processing substrate having the semiconductor region containing the SiC as the main component,
        a shower plate provided so as to face the holding stage and having an area greater than the processing substrate and a plurality of gas ejection holes for ejecting a plasma excitation gas into the process chamber, the gas ejection holes being provided so that the plasma excitation gas is ejected substantially uniformly into a space in the process chamber over an entire portion of the area, greater than the processing substrate, of the shower plate,
        a dielectric plate provided on a side of the shower plate opposite to the holding stage, and
        an antenna plate provided outside the dielectric plate and having an area equal to or greater than the area of the shower plate, the antenna plate being adapted to substantially uniformly radiate a microwave, through the dielectric plate and the shower plate, into a space in the process chamber corresponding to the entire portion of the area of the shower plate over the area, so that, in the space in the process chamber corresponding to the entire portion of the area of said shower plate, the plasma excitation gas ejected in the space is irradiated with the microwave to thereby generate the plasma substantially uniformly over the area.

10. A method of manufacturing the semiconductor device according to claim 9, wherein the antenna plate is an antenna plate with concentrically arranged linear slots.

11. A method of manufacturing the semiconductor device according to claim 7, wherein the gas containing nitrogen is at least one of a nitrogen gas, a NO gas, a $NH_4$ gas, and a $NF_3$ gas.

12. A method of manufacturing the semiconductor device according to claim 7, wherein the second step further comprises a step of generating the microwave-excited plasma from at least one of the gas containing nitrogen and a noble gas.

13. A method of manufacturing the semiconductor device according to claim 7, wherein the second step further comprises a step of generating the microwave-excited plasma from the gas containing nitrogen, a noble gas, and an oxygen gas.

14. A method of manufacturing the semiconductor device according to claim 1, further comprising a step of forming a source region and a drain region in the semiconductor region.

15. A semiconductor device having a gate insulating film on a semiconductor region containing SiC as a main component, wherein the gate insulating film has a carbon content of $1 \times 10^{20}$ atoms/$cm^3$ or less.

16. A semiconductor device according to claim 15, wherein the gate insulating film has an oxide fixed charge of $1 \times 10^{11}$ $cm^{-2}$ or less and an interface trap density of $1 \times 10^{11}$ $cm^{-2}$ or less.

17. A semiconductor device according to claim 15, wherein the gate insulating film includes a film obtained by reforming a silicon oxide film or a silicon oxynitride film deposited on a surface of the semiconductor region, using radicals containing at least nitrogen atoms.

18. A semiconductor device according to claim 15, wherein the gate insulating film contains silicon, oxygen, and nitrogen.

19. A semiconductor device according to claim 15, wherein the gate insulating film is a film obtained by reforming a silicon oxide film or a silicon oxynitride film deposited on a surface of the semiconductor region, using oxygen radicals and radicals containing nitrogen atoms.

20. A semiconductor device according to claim 15, wherein the gate insulating film includes a film obtained by reforming a silicon oxide film deposited on a surface of the semiconductor region, using radicals containing at least nitrogen atoms.

21. A semiconductor device according to claim 15, wherein the gate insulating film includes a film obtained by reforming a silicon oxide film deposited on a surface of the semiconductor region, using oxygen radicals and radicals containing nitrogen atoms.

22. A semiconductor device according to claim 17, wherein the radicals containing the nitrogen atoms are at least one of nitrogen radicals, NO radicals, and $NH_3$ radicals.

23. A semiconductor device according to claim 15, wherein the gate insulating film has a thickness of 5 to 50 nm.

24. A semiconductor device according to claim 15, wherein a gate electrode is formed on the gate insulating film.

25. A semiconductor device according to claim 15, wherein a source region and a drain region are formed in the semiconductor region.

* * * * *